(12) United States Patent
Gao et al.

(10) Patent No.: US 12,106,821 B2
(45) Date of Patent: Oct. 1, 2024

(54) DATA TRANSMISSION CIRCUIT, METHOD OF MAKING IT, AND STORAGE DEVICE

(71) Applicant: ChangXin Memory Technologies, Inc., Hefei (CN)

(72) Inventors: Enpeng Gao, Hefei (CN); Kangling Ji, Hefei (CN); Zengquan Wu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/439,742

(22) PCT Filed: Jul. 8, 2021

(86) PCT No.: PCT/CN2021/105255
§ 371 (c)(1),
(2) Date: Sep. 15, 2021

(87) PCT Pub. No.: WO2022/205662
PCT Pub. Date: Oct. 6, 2022

(65) Prior Publication Data
US 2024/0029766 A1    Jan. 25, 2024

(30) Foreign Application Priority Data

Mar. 29, 2021    (CN) .......................... 202110336625.5

(51) Int. Cl.
*G11C 7/22*    (2006.01)
*G11C 7/10*    (2006.01)

(52) U.S. Cl.
CPC .......... *G11C 7/1066* (2013.01); *G11C 7/1045* (2013.01); *G11C 7/1051* (2013.01); *G11C 7/22* (2013.01); *G11C 7/222* (2013.01)

(58) Field of Classification Search
CPC ... G11C 7/1066; G11C 7/1045; G11C 7/1051; G11C 7/22; G11C 7/222; G11C 7/109;
(Continued)

(56) References Cited

U.S. PATENT DOCUMENTS 5,892,777 A * 4/1999 Nesheiwat ........... G11C 7/1045
365/201
6,139,180 A    10/2000 Usher et al.
(Continued)

FOREIGN PATENT DOCUMENTS

CN    103911603 A    7/2014
CN    108281717 A    7/2018
(Continued)

OTHER PUBLICATIONS

PCT/CN2021/1105255 International Search Report and Written Opinion, mailed Sep. 28, 2021, English Translation.
(Continued)

*Primary Examiner* — Jay W. Radke
(74) *Attorney, Agent, or Firm* — Kilpatrick Townsend & Stockton LLP

(57) ABSTRACT

This application relates to a data transmission circuit, a method making it, and a storage device. The circuit includes a mode register data storage unit and an array area data storage unit. The mode register data storage unit outputs mode register data in response to a first clock signal; the output terminal of the array area data storage unit and the output terminal of the mode register data storage unit are both connected to the first node, the array area data storage unit receives array area data in response to the first pointer signal, and outputs the array area data in response to the second pointer signal. This technic can accurately control the mode register data and the array area data to output through the respective output channels in turn.

19 Claims, 29 Drawing Sheets

(58) Field of Classification Search
CPC .... G11C 7/1048; G11C 7/1063; G11C 7/1078
See application file for complete search history.

(56) References Cited

U.S. PATENT DOCUMENTS

| | | | |
|---|---|---|---|
| 2006/0259711 A1* | 11/2006 | Oh | G06F 13/4243 |
| | | | 711/154 |
| 2018/0322937 A1 | 11/2018 | Mazumder et al. | |
| 2019/0023126 A1 | 1/2019 | Khafagy et al. | |
| 2019/0237126 A1 | 8/2019 | Miyamoto | |
| 2020/0082869 A1 | 3/2020 | Miyamoto | |

FOREIGN PATENT DOCUMENTS

| | | |
|---|---|---|
| CN | 111845448 A | 10/2020 |
| CN | 111934032 A | 11/2020 |
| JP | 2010-182367 A | 8/2010 |
| JP | 2015-109124 A | 6/2015 |
| JP | 2015-219927 A | 12/2015 |
| WO | WO 2014/129438 A1 | 8/2014 |
| WO | WO 2022/105255 A1 | 5/2022 |

OTHER PUBLICATIONS

JP 2022-547934 Notice of Reasons for Refusal mailed Aug. 17, 2023, English translation.
Korean Intellectual Property Office, Office Action Issued in Application No. 10-2022-7028419, Jul. 15, 2024, 14 pages.

* cited by examiner

DATA TRANSMISSION CIRCUIT, METHOD OF MAKING IT, AND STORAGE DEVICE

CROSS REFERENCES TO RELATED APPLICATIONS

This application claims the benefit of priority to Chinese patent application CN2021103366255 filed with the Chinese Patent Office on Mar. 29, 2021, entitled "Data Transmission Circuit, Method of Making it, and Storage Device" the contents of both applications are incorporated herein by reference in its entirety.

TECHNICAL FIELD

This application relates to the field of electronics technology, in particular, to a data transmission circuit and method, and a storage device.

BACKGROUND

A semiconductor memory device usually includes a memory array area and a peripheral circuit area. The memory array area is provided with a memory cell array including a plurality of memory cells: the peripheral circuit area is provided with a control circuit for controlling reading and writing and a mode register for storing mode register data. The mode register data stored in the mode register can be read out by issuing a mode register read command.

If the operating parameter requirements of a particular type of semiconductor storage device are met, the time to read out the mode register data in response to the mode register read command will be set to match the time to read out the array area data in response to the array area data read command, to realize that the timing of the transmission path for reading out the mode register data in response to the mode register read command is the same as the timing of the transmission path for reading out the array area data in response to the array area data read command.

SUMMARY

The first embodiment of the present application provides a data transmission circuit, including a mode register data storage unit, and an array area data storage unit. The mode register data storage unit is used to output mode register data in response to a first clock signal: an output terminal of the mode register data storage unit and an output terminal of the array area data storage unit are both connected to the first node. The array area data storage unit is used for receiving array area data in response to a first pointer signal, and is also used for outputting the array area data in response to a second pointer signal.

In the data transmission circuit of the foregoing embodiment, the mode register data storage unit is configured to respond to the first clock signal by outputting the mode register data to the output terminal of the mode register data storage unit, and the array area data storage unit is configured to respond to a first point signal by receiving the array area data, and to respond to the second pointer signal by outputting the array area data to the output terminal of the array area data storage unit, wherein both of the output terminals are connected to a first node. In this manner, precise control of the mode register data storage unit and the array area data storage unit is realized so that the response time for the mode register read command to read out the mode register data from the mode register matches the time for the readout of the array area data in response to the array area data read command, and the mode register data and the array area data are output through their respective output channels (terminals) and through a common path (common node) in order to precisely control the mode register data and the array area data.

The second embodiment of the application provides a data transmission circuit, including a controllable delay module, a mode register data processing unit, an array area data storage unit, and a mode register data storage unit. The controllable delay module is used to respond to a mode register read command by generating a preset read delay signal: the mode register data processing unit is connected to the controllable delay module, and is used to read mode register data from a mode register in response to the mode register read command, and is also used to respond to the preset read delay Signal by outputting the mode register data to the mode register data storage unit: the output end of the array area data storage unit and the output end of the mode register data storage unit are both connected to a first node. The array area data storage unit is used to receive the array area data in response to a first pointer signal, and also used to output the array area data in response to a second pointer signal; and the mode register data storage unit is used to output the mode register data in response to a first clock signal.

In the data transmission circuit in the above embodiment, the preset read delay signal is generated by the controllable delay module in response to the mode register read command, so that the mode register data processing unit reads the mode register data from the mode register in response to the mode register read command, and outputs the mode register data to the mode register data storage unit in response to the preset read delay signal; and the mode register data storage unit outputs the mode register data in response to the first clock signal, and the output terminal of the array area data storage unit is also the output end of the mode register data storage unit since both are connected to the first node, and the array area data storage unit can receive the array area data in response to the first pointer signal and output the array area data in response to the second pointer signal. The difference in control between the mode register storage unit and the array area data storage unit allows matching of the time of reading out the mode register data in response to the mode register read command with the time of reading out the array area data in response to the array area data read command, so as to precisely control the mode register data and the array area data output via respective output channels (terminals) connected to a first node. Once the operation delay of the controllable delay module in this application is determined and set, it is less affected by changes in the working environment, which can effectively avoid control errors in the data transmission path due to the influence of the working environment; and the operation delay of the controllable delay module can be controlled and adjusted, which can meet the operating parameter requirements of different types of semiconductor storage devices.

The third embodiment of the application provides a data transmission circuit, including a delay module, a mode register data processing unit, an array area data storage unit, and a mode register data storage unit. The delay module is used to delay a mode register read command from the moment of receiving the mode register read command. After a first preset time, a preset read delay signal is generated: the mode register data processing unit is connected to the delay module, and is used to read mode register data from the mode register in response to the mode register read command, and is also used to output the mode register data to the mode register data storage unit in respond to the preset read delay signal: the output terminal of the array area data storage unit and the output terminal of the mode register data storage unit are both connected to the first node. The array area data storage unit receives the array area data in response to a first pointer signal, and outputs the array area data in response to a second pointer signal. The mode register data storage unit is used to output the mode register data in response to a first clock signal.

In the data transmission circuit according to the third embodiment, the delay module is set to generate a preset read delay signal after a first preset time delay, from the moment when the mode register read command is received, so that the mode register data processing unit responds to the mode register read command, reads the mode register data from the mode register, and outputs the mode register data to the mode register data storage unit in response to the preset read delay signal; and enables the mode register data storage unit to output the mode register data in response to the first clock signal. The output end of the array area data storage unit and the output end of the mode register data storage unit are both connected to the first node. The array area data storage unit can receive array area data in response to the first pointer signal and output the data in response to the second pointer signal. The data transmission circuit enables precise control of the mode register data storage unit and the array area data storage unit, so that the time of responding to the mode register read command to read the data from the mode register matches the time of responding to the array area data read command to read the array area data, and also precisely controls the mode register data and array area data to be output through their respective output channels (terminals) that share a path, the first node.

The fourth embodiment of the present application provides a storage device, including a memory cell array, a mode register, and any of the data transmission circuits described in the other embodiments of the present application: wherein the memory cell array is used to store data in the array area, and the mode register is used for storing mode register data. In this embodiment, the time to read out the mode register data in response to the mode register read command will be set to match the time to read out the array area data in response to the array area data read command, and it is realized that the timing of the transmission path for reading out the mode register data in response to the mode register read command is the same as the timing of the transmission path for reading out the array area data in response to the array area data read command e.

The fifth embodiment of the present application provides a data transmission method, including the following:

Outputting mode register data, based on the response of a mode register data storage unit to a first clock signal, and:

Receiving array area data, based on the response of an array area data storage unit to a first pointer signal, and outputting array area data as a response to the second pointer signal, wherein an output terminal of the array area data storage unit and an output terminal of the mode register data storage unit are all connected to a first node.

The sixth embodiment of this application provides a data transmission method, including the following:

Generating a preset read delay signal, based on a controllable delay module responding to a mode register read command:

Reading mode register data from a mode register in response to a mode register read command, and outputting the mode register data to a mode register data storage unit in response to a preset read delay signal:

Outputting mode register data, based on the mode register data storage unit responding to the first clock signal; and Receiving array area data, based on an array area data storage unit responding to a first pointer signal, and outputting the array area data in response to a second pointer signal, wherein an output terminal of the array area data storage unit and an output terminal of the mode register data storage unit are all connected to a first node.

The seventh embodiment of the present application provides a data transmission method, including the following:

Generating a preset read delay signal from a delay module, after delaying a mode register read command by a first preset time, from the moment when the mode register read command is received:

Reading mode register data from a mode register, based on a data processing unit responding to the mode register read command, and outputting the mode register data to a mode register data storage unit in response to the preset read delay signal:

Outputting mode register data, based on the mode register data storage unit responding to a first clock signal; and Receiving array area data, based on an array area data storage unit responding to a first pointer signal to receive the array area data, and the array area data storage unit outputting the array area data in response to a second pointer signal, wherein an output terminal of the array area data storage unit and an output terminal of the mode register data storage unit are both connected in common to a first node.

BRIEF DESCRIPTION OF THE DRAWINGS

To more clearly describe the embodiments of the present application, the following will briefly introduce the drawings in the description of the embodiments. The drawings in the following description illustrate embodiments of the present application. For those of ordinary skill in the art, other drawings can be obtained based on these drawings without creative work.

FIG. 11b is a schematic diagram of the working time sequence of FIG. 11a:

DESCRIPTION OF REFERENCE NUMBERS

Figure 1:
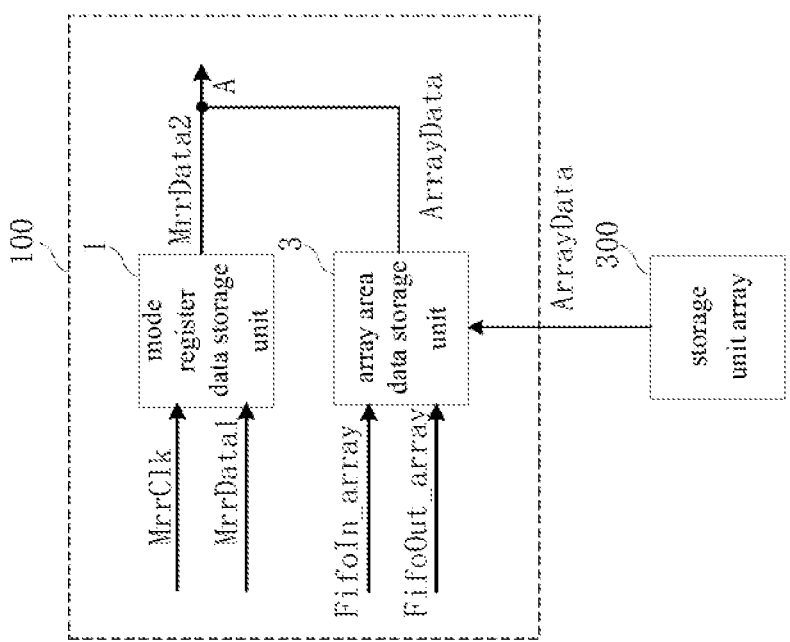
FIG. 1 is a structural block diagram of a data transmission circuit provided according to the first embodiment of this application.

100. Data transmission power; 1. Mode register data storage unit; 3. Array area data storage unit; 4. Delay module; 31. First storage unit; 10. Controllable delay module; 20. Mode register data processing unit; 200. Mode register; 11. Reference delay unit; 12. Controllable delay unit; 121. Delay unit; 122. First controllable switch unit; 41. First delay unit; 42. Second delay unit; 43. Third delay Unit; 431, first sub-delay unit; 432, second sub-delay unit; 1101, first read operation delay unit; 1201, column selection control module; 1301, third read operation delay unit; 21, first-in first-out pointer processing Unit; 22. First-in first-out data processing unit; 23. Mode register read command processing unit; 221. Second storage unit; 2211. Storage sub-unit; 2212. Driver; 30. Command decoding circuit; 40. Array area data processing unit; 300. Storage unit array; 50. First selector; 51. First-in first-out storage unit; 52. Selection module; 511. Third storage unit; 60. First-in first-out memory; 70. Serial-to-parallel conversion circuit; 80, data driving module; 90. Data terminal; 501. First flip-flop; 502. Second flip-flop; 503. Third flip-flop; 504. Fourth flip-flop; 400. Delay chain; 1000. Storage device; and 2000. Delay circuit.

DETAILED DESCRIPTION OF THE PREFERRED EMBODIMENTS

In order to facilitate the understanding of this application, the following will make a more comprehensive description of this application with reference to the relevant drawings. The preferred embodiment of the application is shown in the accompanying drawings. However, this application can be implemented in many different forms and is not limited to the embodiments described herein. On the contrary, the purpose of providing these embodiments is to make the disclosure of this application more thorough and comprehensive.

Unless otherwise defined, all technical and scientific terms used herein have the same meaning as commonly understood by those skilled in the technical field of this application. The terminology used in the specification of the application herein is only for the purpose of describing specific embodiments, and is not intended to limit the application.

In addition, certain terms used throughout the specification and the following claims refer to specific elements. Those skilled in the art will understand that manufacturers can refer to components with different names. This document does not intend to distinguish between components with different names but the same function. In the following description and examples, the terms "including" and "including" are used openly, and therefore should be interpreted as "including, but not limited to . . . ". Likewise, the term "connected" is intended to express an indirect or direct electrical connection. Correspondingly, if one device is connected to another device, the connection can be done through a direct electrical connection, or through an indirect electrical connection between the other equipment and the connector.

It should be understood that although the terms "first", "second", etc. may be used herein to describe various elements, these elements should not be limited by these terms. These terms are only used to distinguish one element from another element. For example, without departing from the scope of the present application, the first element may be referred to as the second element, and similarly, the second element may be referred to as the first element.

Please refer to FIG. 1, in an embodiment of the present application, a data transmission circuit 100 is provided, including a mode register data storage unit 1 and an array area data storage unit 3. The mode register data storage unit 1 is used to respond to a first clock Signal MrrClk to output the mode register data MrrData2: the output end of the array area data storage unit 3 and the output end of the mode register data storage unit 1 are both connected to the first node A, and the array area data storage unit 3 is used to respond to the first pointer signal FifoIn_array, receive array area data Array Data, and output array area data Array Data in response to the second pointer signal FifoOut_array.

As an example, please continue to refer to FIG. 1, by setting the mode register data storage unit 1 to output the mode register data MrrData2 in response to the first clock signal MrrClk, wherein the mode register data storage unit 1 outputs the mode register data in response to the first clock signal MrrClk before MrrData2, read the mode register data MrrData1 from the previous data line: then set the output terminal of the array area data storage unit 3 and the output terminal of the mode register data storage unit 1 to be connected to the first node A. In response to the first pointer signal FifoIn_array, the array area data storage unit 3 receives the array area data Array Data in response to the second pointer signal FifoOut_array to output the array area data Array Data, which realizes the differentiated control of the mode register data storage unit 1 and the array area data storage unit 3, so that the time to read out the mode register data MrrData2 in response to the mode register read command will be matched with the time to read out the array area data Array Data in response to the array area data read command, and the mode register data MrrData and the array area data Array Data are outputted through the respective output channels in turn. The MrrData1 and MrrData2 here can be the same or can match a preset algorithm.

Figure 2:
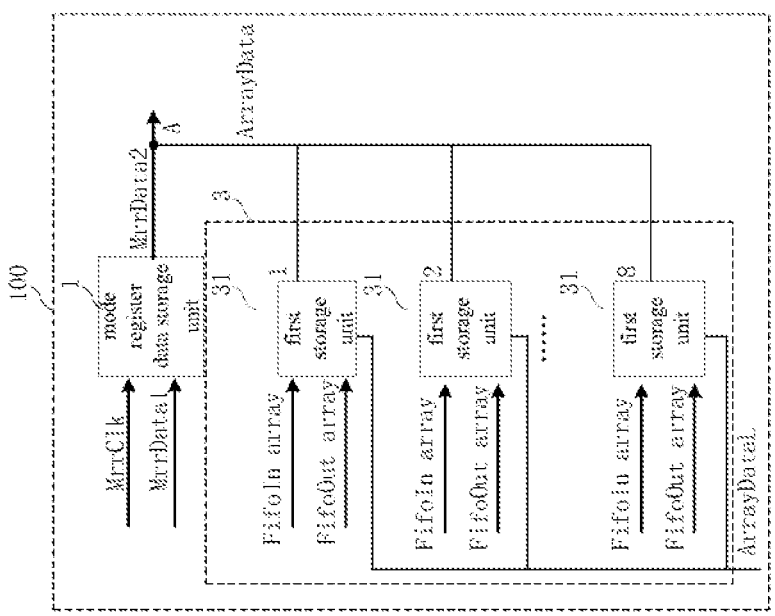
FIG. 2 is a structural block diagram of a data transmission circuit provided according to the second embodiment of this application.

Further, referring to FIG. 2, in an embodiment of the present application, the array area data storage unit 3 includes eight first storage units 31, and the output terminal of each first storage unit 31 is connected to the first node A, each The input ends of the first storage unit 31 are all connected to the first data signal line Array DataL, and the first data signal line Array DataL is used to transmit the array area data Array Data, so as to realize precise control of the transmission of the array area data Array Data.

Further, continue to refer to FIG. 2. In an embodiment of the present application, the driving clock frequencies of the first pointer signal FifoIn_array and the second pointer signal FifoOut_array are the same, so that the input data and output data of the array area data storage unit 3 can be set to maintain a consistent transmission rate to realize data in and out.

Figure 3:
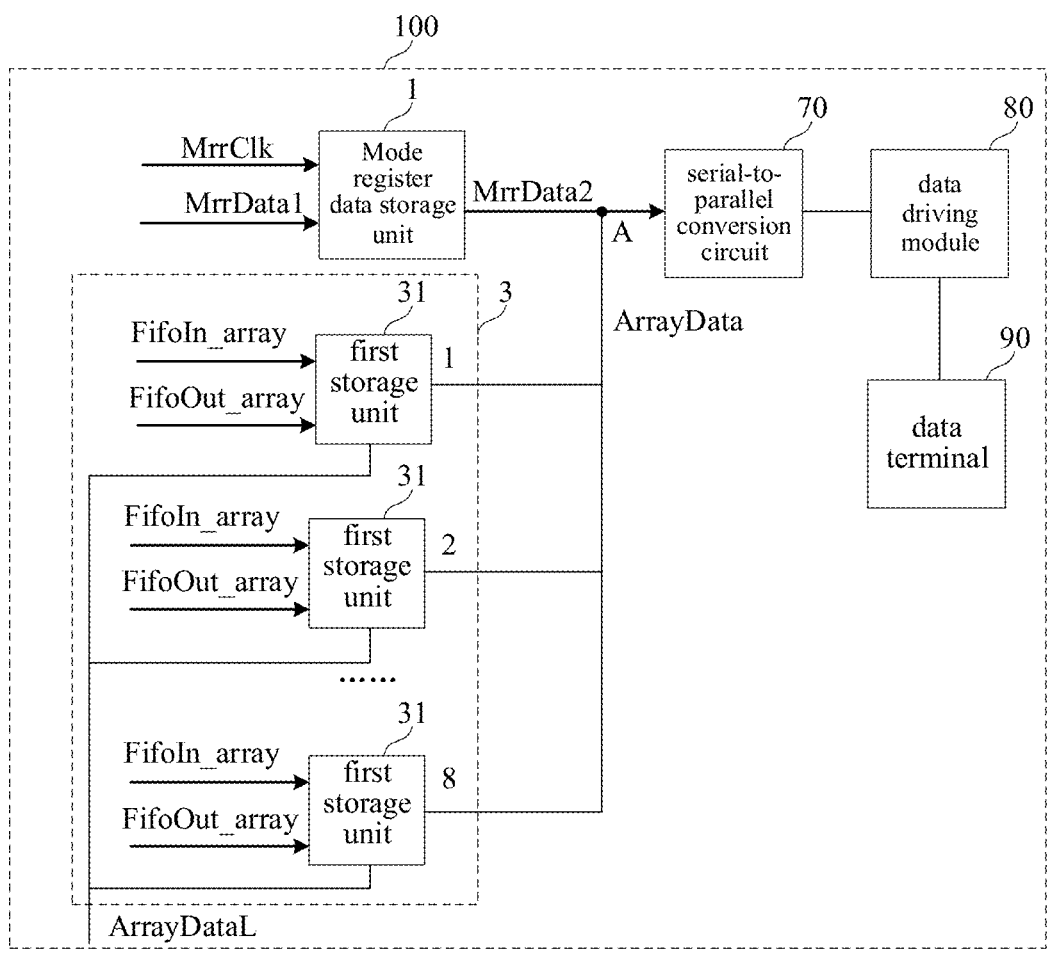
FIG. 3 is a structural block diagram of a data transmission circuit provided according to the third embodiment of this application.

Further, referring to FIG. 3, in an embodiment of the present application, the data transmission circuit 100 further includes a serial-to-parallel conversion circuit 70 and a data driving module 80. The input terminal of the serial-to-parallel conversion circuit 70 is connected to the first node A: the data driving module 80 is connected to the output terminal of the serial-to-parallel conversion circuit 70 for outputting the mode register data MrrData2 or the array area data Array Data. By using the serial-parallel conversion circuit 70 to convert the received data into serial data and then provide the data to the data driving module 80 for output, it is convenient to improve the efficiency of data transmission.

Figure 4:
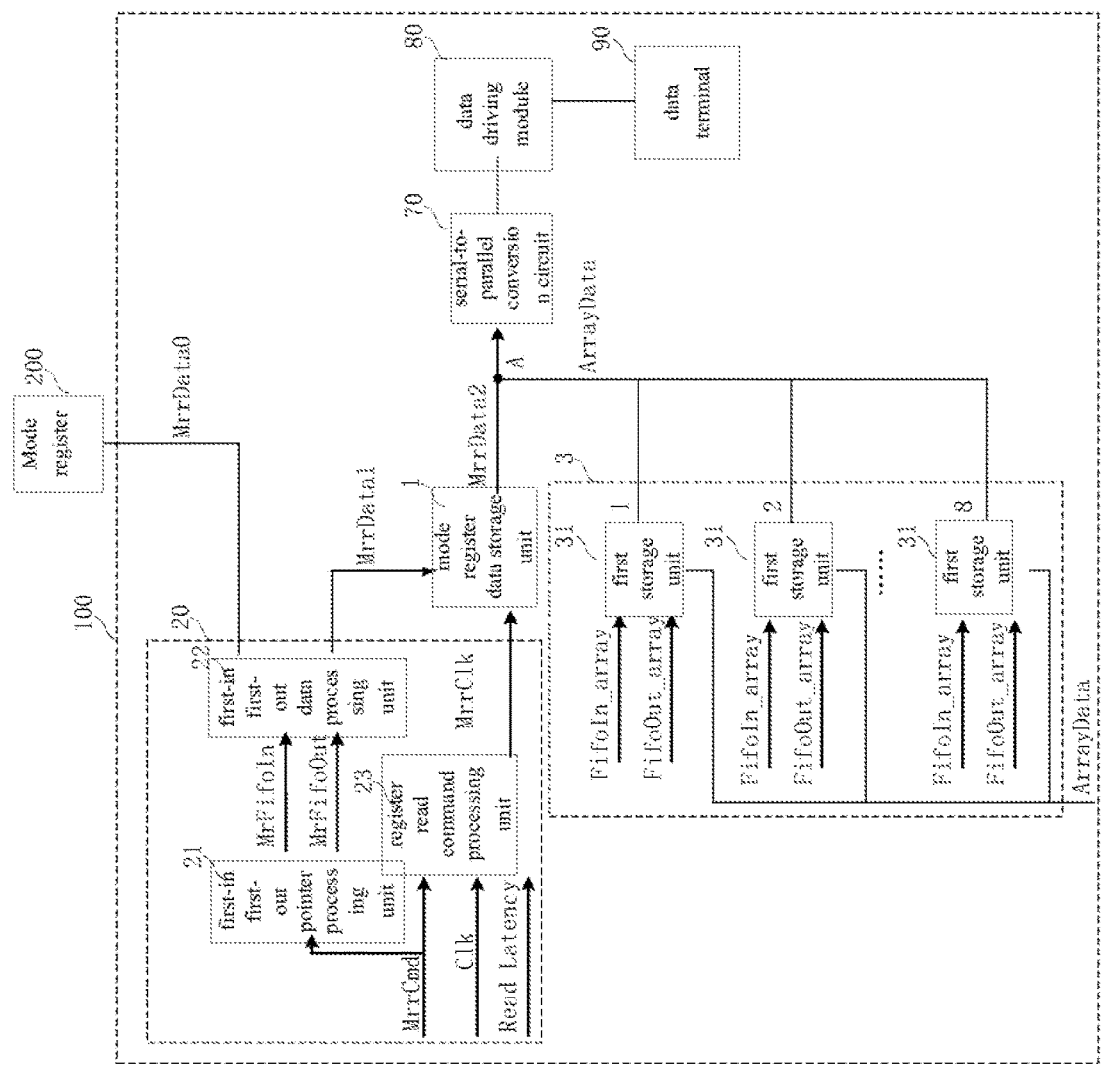
FIG. 4 is a structural block diagram of a data transmission circuit provided according to the fourth embodiment of this application.

Further, referring to FIG. 4, in an embodiment of the present application, the data transmission circuit 100 further includes a mode register data processing unit 20, and the mode register data processing unit 20 includes a first-in first-out pointer processing unit 21 and a first-in first-out data processing unit 22. The first-in first-out data processing unit 22 and the mode register read command processing unit 23: the first-in first-out pointer processing unit 21 is used to respond to the mode register read command MrrCmd to generate the third pointer signal MrFifoIn and the fourth pointer signal MrFifoOut: the first-in first-out data processing unit 22 and the first-in first-out pointer processing unit 21 and the mode register data storage unit 1 are both connected to read the mode register data MrrData0 from the mode register 200 in response to the third pointer signal MrFifoIn. and are also used to respond to the fourth pointer signal MrFifoOut output the mode register data MrrData1 to the mode register data storage unit 1: the mode register read command processing unit 23 is configured to generate the first clock signal MrrClk according to the received mode register read command MrrCmd, the second clock signal Clk, and the preset read delay signal Read Latency. According to the mode register read command MrrCmd, the second clock signal Clk and the preset read delay signal Read Latency control mode register data MrrData1 through the mode register data storage unit 1 output time, to achieve precise control mode register data MrrData0, array area data Array Data in turn output via respective data output channels. The MrrData0 and MrrData1 here can be the same or can match a preset algorithm.

As an example, please continue to refer to FIG. 4. In an embodiment of the present application, the third pointer signal MrFifoIn and the fourth pointer signal MrFifoOut have the same driving clock frequency, so as to facilitate the realization of the first-in first-out data processing unit 22 to read data and precise control of the time difference between output data.

Figure 5A:
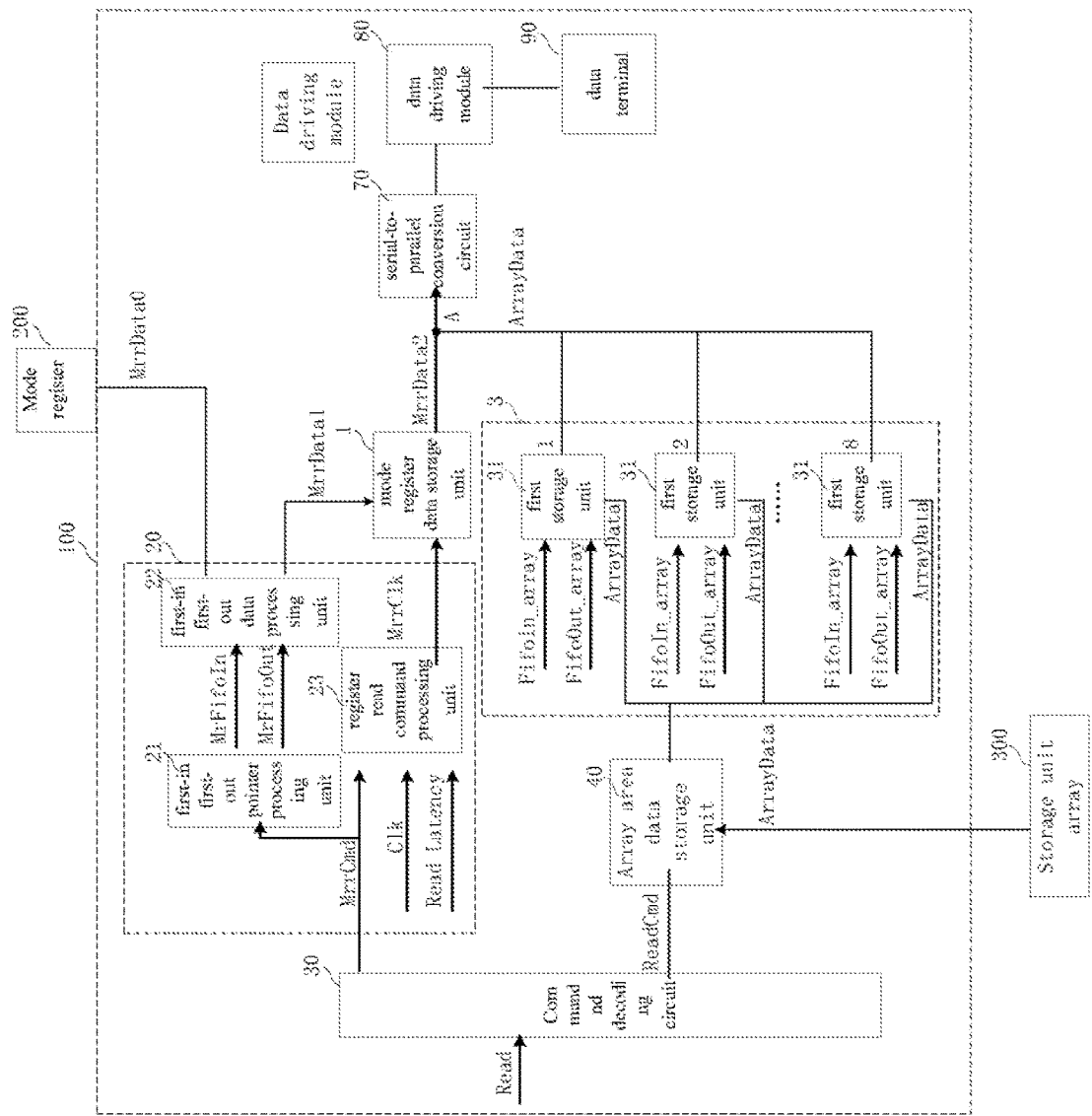
FIG. 5a is a structural block diagram of a data transmission circuit provided according to a fifth embodiment of this application.
Figure 5B:
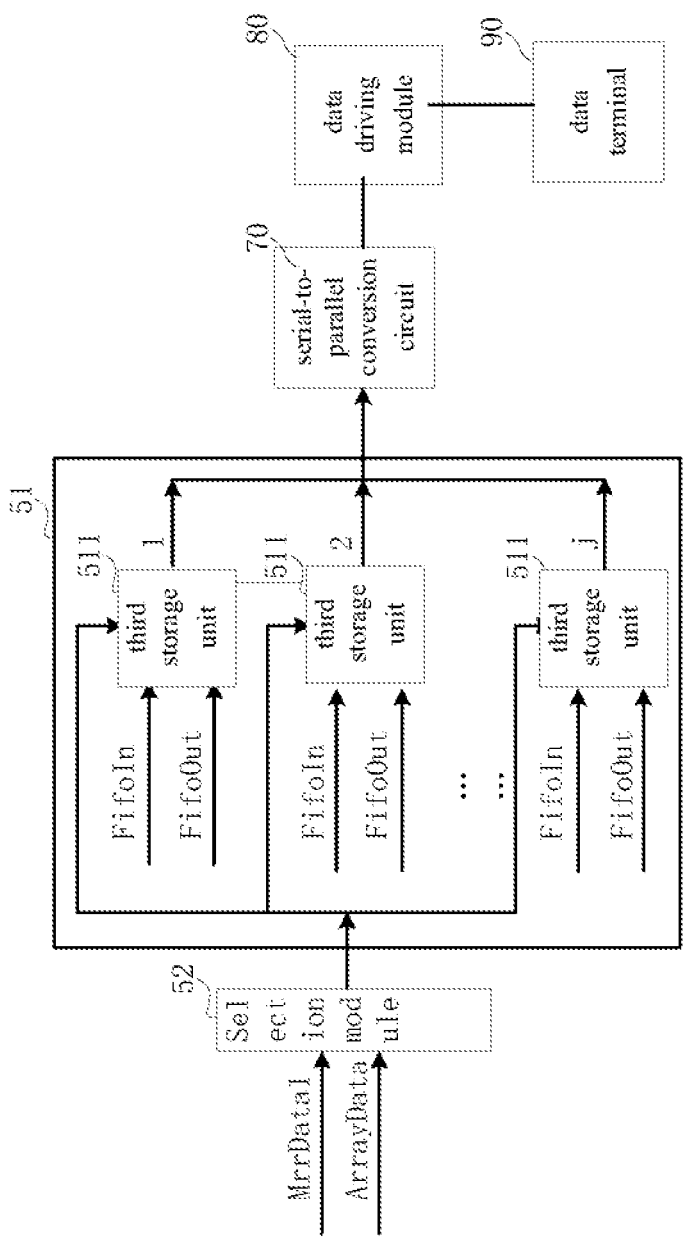
FIG. 5b is a structural block diagram of a data transmission circuit provided according to the sixth embodiment of this application.

Further, referring to FIGS. 5a and 5b. In an embodiment of the present application, the data transmission circuit 100 further includes a command decoding circuit 30 and an array data processing unit. The first output terminal of the command decoding circuit 30 and the input terminal of the mode register command processing unit 23 and the input terminal of the first-in first-out pointer processing unit 21 are both connected to receive the read command Read, decode the read command Read and determine whether the read command is the mode register read command MrrCmd. If so, the output mode of the register read command MrrCmd, on the contrary, generates the array area data read command ReadCmd: the input end of the array area data processing unit 40 is connected to the second output end of the command decoding circuit 30 for responding to the array area data read command ReadCmd from the storage unit. The array area data Array Data is read from the storage unit array 300 to provide the array area data storage unit 3. In this embodiment, the mode register data MrrData2 and the array area data Array Data are read out via a data transmission circuit 100, as opposed to using a different data transmission path to read the mode register data MrrData and the array area data Array Data.

As an example shown in FIG. 5b. In an embodiment of the present application, the mode register data MrrData1 and the array area data Array Data are received by setting the selection module 52, and the output terminal of the selection module 52 is connected to the first-in first-out storage unit 51. The first-in first-out storage unit 51 includes j third storage units 511 connected in parallel, j is a positive integer, and j can be set to be equal to the bit width of the array area data Array Data. The mode register data MrrData1 and the array area data Array Data are sequentially output through the first-in first-out storage unit 51, the serial-to-parallel conversion circuit 70, the data driving module 80, and the data terminal 90 by controlling the switching of the selection module 52. Referring to FIG. 5a and FIG. 5b at the same time, the mode register data MrrData0 and the array area data Array Data in FIG. 5a are transmitted to the serial-to-parallel conversion circuit 70 through different FIFOs (first-in first-out registers). The mode register data MrrData0 and the array area data Array Data in FIG. 5b is transmitted to the serial-to-parallel conversion circuit 70 through the same FIFO. The technics of FIG. 5a is more flexible for the timing control of the data transmission circuit, and the technics of FIG. 5b can make the area of the data transmission circuit smaller.

Figure 6:
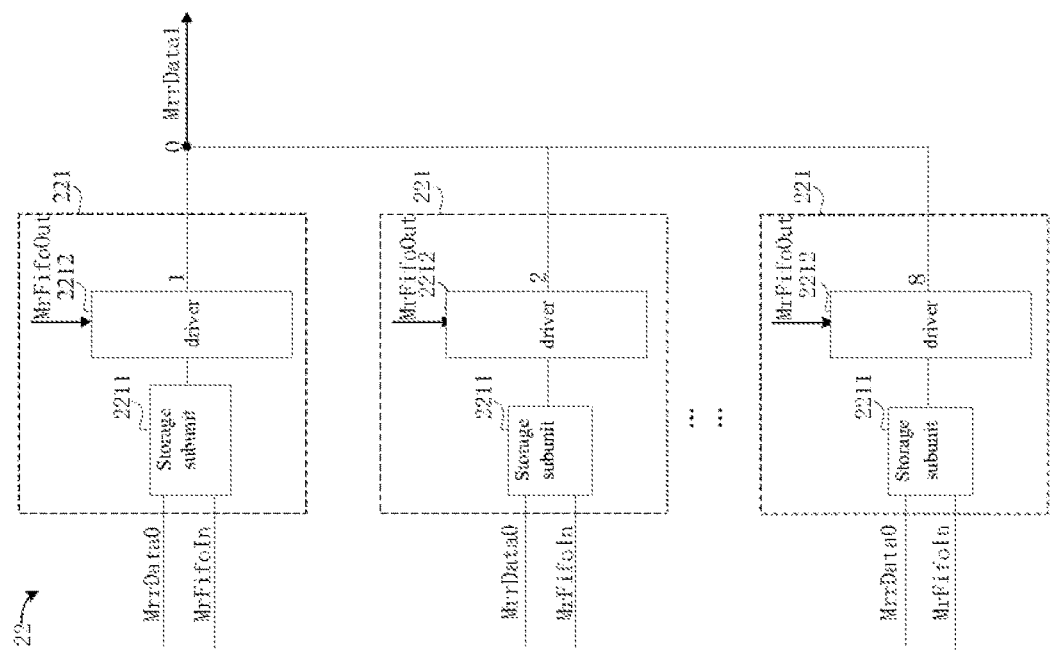
FIG. 6 is a structural block diagram of a first-in first-out data processing unit in a data transmission circuit provided according to an embodiment of the application.

As an example shown in FIG. 6, in an embodiment of the present application, the first-in first-out data processing unit 22 includes a second storage unit 221, and the output terminals of a plurality of second storage units 221 are all connected to the second node O: the second storage unit 221 includes a storage subunit 2211 and a driver 2212. The input end of the driver 2212 is connected to the output end of the storage subunit 2211. The storage subunit 2211 is driven by the third pointer signal MrFifoIn to receive the mode register data MrrData0. The driver 2212 is in the second The four-pointer signal MrFifoOut drives the output mode register data MrrData1, so that the first-in first-out data processing unit 22 cooperates with the first-in first-out pointer processing unit 21 to achieve precise control of the time when the mode register read command MrrCmd reads the mode register data MrrData1, thereby It can precisely control the time when the mode register read command MrrCmd reads the mode register data MrrData1, which matches the time when the array area data read command ReadCmd reads the array area data Array Data.

Figure 7:
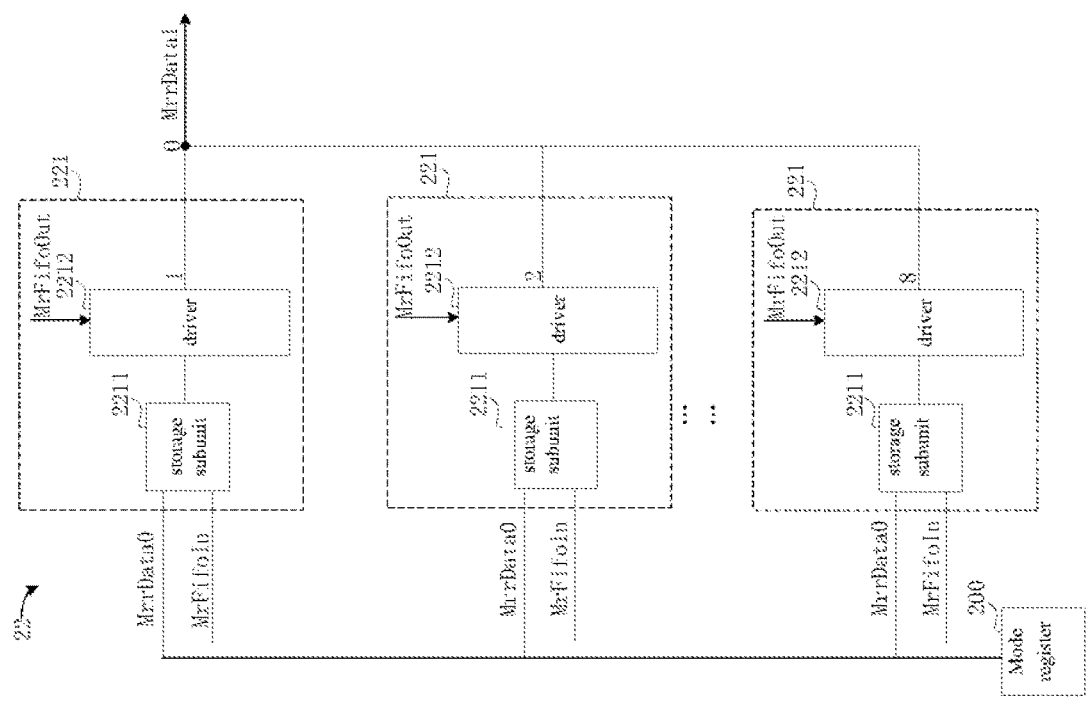
FIG. 7 is a structural block diagram of a first-in first-out data processing unit in a data transmission circuit provided according to another embodiment of the application.

As an example, please refer to FIG. 7. In an embodiment of the present application, the data input terminal of each storage subunit 2211 is connected to the mode register 200, so that each storage subunit 2211 responds to the third pointer signal MrFifoIn from the mode register 200 After reading the mode register data MrrData0, each driver 2212 outputs the mode register data MrrData1 in response to the fourth pointer signal MrFifoOut.

As an example shown in FIG. 7, in an embodiment of the present application, the driving clock frequency of the third pointer signal MrFifoIn and the fourth pointer signal MrFifoOut are the same, so as to facilitate the reading of the first-in first-out data processing unit 22. Accurate control of the time difference between fetching data and output data.

Figure 8A:
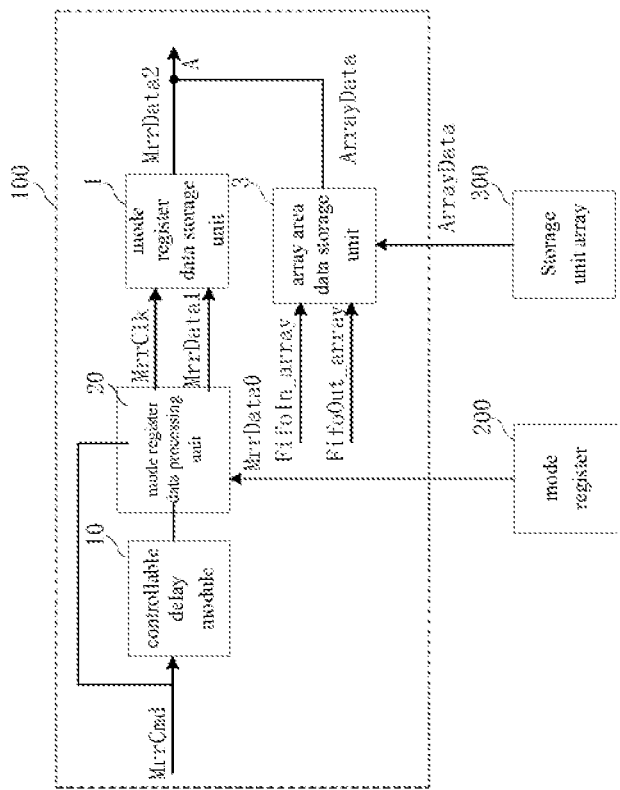
FIG. 8a is a structural block diagram of a data transmission circuit provided according to a seventh embodiment of this application.

Referring to FIG. 8a, in an embodiment of the present application, a data transmission circuit 100 is provided, including a controllable delay module 10, a mode register data processing unit 20, an array area data storage unit 3, and a mode register data storage unit 1. The controllable delay module 10 is used to generate a preset read delay signal Read Latency in response to the mode register read command MrrCmd: the mode register data processing unit 20 is connected to the controllable delay module 10 for reading from the mode register 200 in response to the mode register read command MrrCmd to output the mode register data MrrData0, and is also used to output the mode register data MrrData1 to the mode register data storage unit 1 in response to the preset read delay signal Read Latency: the output terminal of the array area data storage unit 3 and the output terminal of the mode register data storage unit 1 are all connected to the first node A, and are used to receive array area data Array Data in response to the first pointer signal FifoIn_array, and are also used to output array area data Array Data in response to the second pointer signal FifoOut_array: the mode register data storage unit 1 is used to respond to the first The clock signal MrrClk outputs the mode register data MrrData2.

As an example, please continue to refer to FIG. 8a, by setting the controllable delay module 10 to respond to the mode register read command MrrCmd to generate the preset read delay signal Read Latency, so that the mode register data processing unit 20 responds to the mode register read command MrrCmd to read from the mode register 200 Output the mode register data MrrData0 and output the mode register data MrrData1 to the mode register data storage unit 1 in response to the preset read delay signal Read Latency; and set the mode register data storage unit 1 to output the mode register data MrrData2 in response to the first clock signal MrrClk. The output terminal of the array area data storage unit 3 and the output terminal of the mode register data storage unit 1 are both connected to the first node A. The array area data storage unit 3 can receive the array area data Array Data in response to the first pointer signal FifoIn_array, and respond to the second The pointer signal FifoOut_array outputs the array area data Array Data, which realizes the different control of the mode register data storage unit 1 and the array area data storage unit 3, so that the time to read out the mode register data MrrData2 in response to the mode register read command MrrCmd will be matched with the time to read out the array area data Array Data in response to the array area data read command ReadCmd, and the precise control mode register data MrrData2 and the array area data Array Data are output through the respective output channels in turn. Once the operation delay of the controllable delay module 10 in this application is determined, it is less affected by changes in the working environment, and can effectively avoid control errors in the data transmission path due to the influence of the working environment; and the operation delay of the controllable delay module 10 can control and adjust to meet the operating parameter requirements of different types of semiconductor storage devices.

As an example, please continue to refer to FIG. 8a. In an embodiment of the present application, between the start time when the mode register data processing unit 20 outputs the mode register data MrrData1 and the time when the controllable delay module 10 receives the mode register read command MrrCmd The time difference is the first preset threshold, so that the time to read out the mode register data MrrData2 in response to the mode register read command MrrCmd will be matched with the time to read out the array area data Array Data in response to the array area data read command ReadCmd.

Figure 8B:
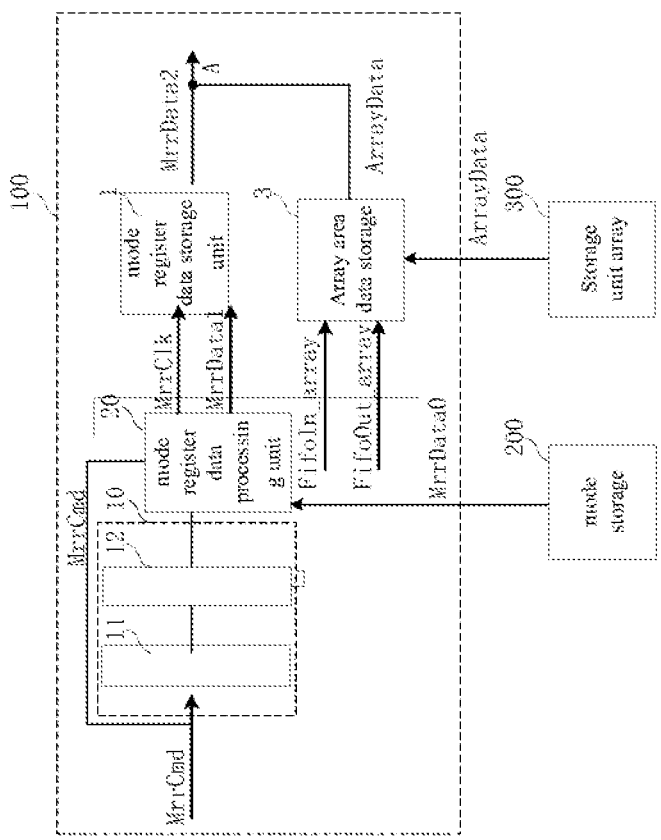
FIG. 8b is a structural block diagram of a data transmission circuit provided according to the eighth embodiment of this application.

Further, referring to FIG. 8b, in an embodiment of the present application, the controllable delay module 10 includes a reference delay unit 11 and a controllable delay unit 12. The reference delay unit 11 is used to generate an initial preset in response to the mode register read command MrrCmd Suppose the read delay signal Read Latency: the controllable delay unit 12 is connected to the output end of the reference delay unit 11 and the input end of the mode register data processing unit 20, and is used for delaying the delay from the moment of receiving the initial preset read delay signal Read Latency. After the delay time is set, a preset read delay signal Read Latency is generated; wherein, the operation delay of the controllable delay unit 12 and the operation delay of the reference delay unit 11 are equal to the first preset threshold. By setting the sum of the operation delay of the reference delay unit 11 and the operation delay of the controllable delay unit 12 to be equal to the first preset threshold, the operation delay range of the controllable delay unit 12 is reduced to increase the operation delay of the controllable delay module 10 and its the efficiency and accuracy of the first preset threshold.

Figure 8C:
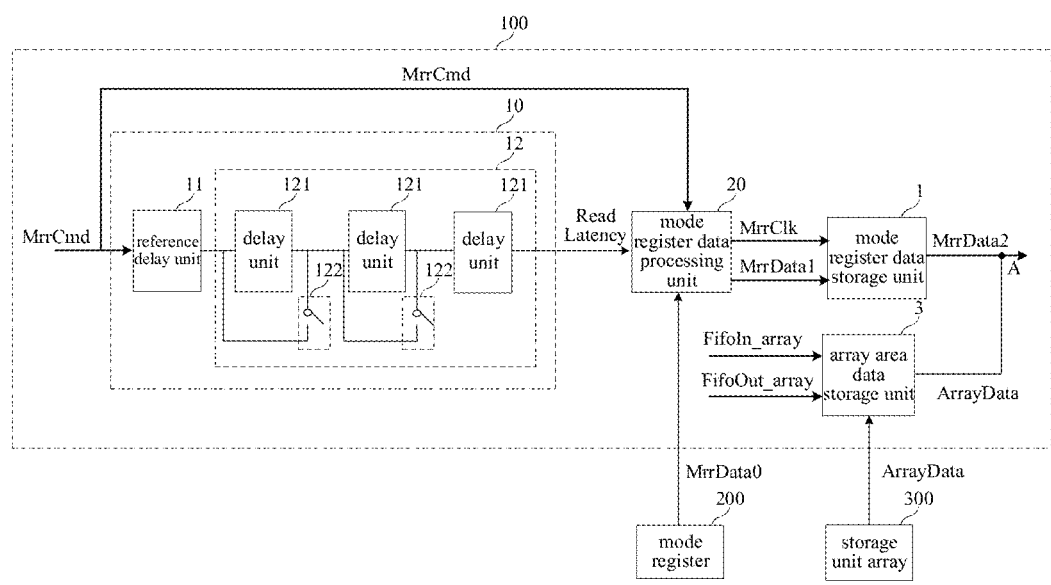
FIG. 8c is a structural block diagram of a data transmission circuit provided according to the ninth embodiment of this application.

Further, referring to FIG. 8c, in an embodiment of the present application, the controllable delay unit 12 includes three delay units 121 connected in series: wherein, two delay units 121 are connected in parallel with a first controllable switch unit 122: wherein by controlling the on and off of each first controllable switch unit 122, the number of delay units 121 connected in series between the reference delay unit 11 and the mode register data processing unit 20 in the controllable delay unit 12 is changed to adjust the operation delay of the controllable delay unit 12. The operation delay of the controllable delay unit 12 realizes the gradient control, so as to improve the efficiency and accuracy of adjusting the operation delay of the controllable delay module 10 to the first preset threshold.

Figure 8D:
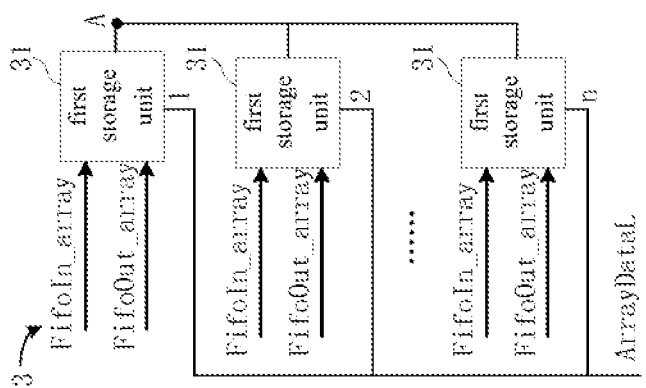
FIG. 8d is a structural block diagram of a data storage unit in an array area in a data transmission circuit provided according to an embodiment of the application.

As an example, please refer to FIG. 8d. In an embodiment of the present application, the array area data storage unit 3 includes a plurality of first storage units 31, and the output terminal of each first storage units 31 is connected to the first node A, each of the input ends of the first storage units 31 are all connected to the first data signal line Array DataL, and the first data signal line Array DataL is used to transmit the array area data Array Data, so as to realize precise control of the transmission of the array area data Array Data.

As an example, please continue to refer to FIG. 8d. In an embodiment of the present application, the driving clock frequency of the first pointer signal FifoIn_array and the second pointer signal FifoOut_array are the same, so as to set the input data and output data of the array area data storage unit 3, to maintain a consistent transmission rate to realize data in and out.

Figure 8E:
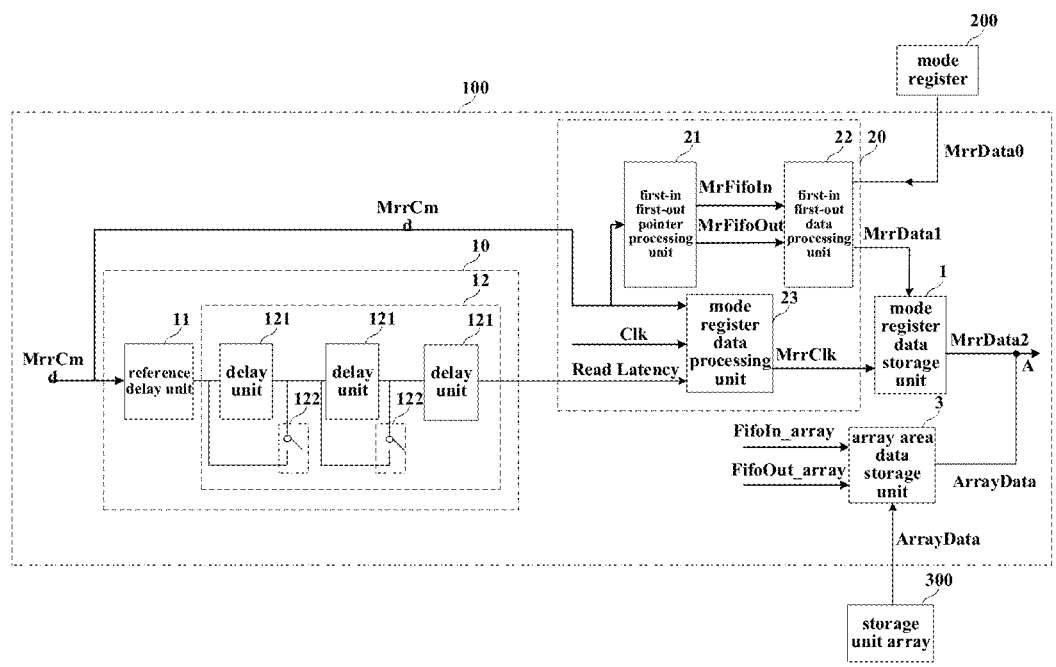
FIG. 8e is a structural block diagram of a data transmission circuit provided according to the tenth embodiment of this application.

Further, referring to FIG. 8e, as an embodiment of the present application, the mode register data processing unit 20 includes a mode first-in first-out pointer processing unit 21, a first-in first-out data processing unit 22, and a mode register read command processing unit 23. The mode register read command processing unit 23 is used to generate the first clock signal MrrClk according to the received mode register read command MrrCmd, the second clock signal Clk and the preset read delay signal Read Latency: the first-in first-out pointer processing unit 21 is used to respond to the mode register read command MrrCmd generates the third pointer signal MrFifoIn and the fourth pointer signal MrFifoOut: the first-in first-out data processing unit 22 is connected with the first-in first-out pointer processing unit 21 and the mode register data storage unit 1 to respond to the third pointer signal MrFifoIn from the mode register 200 reads the mode register data MrrData0, and is also used to output the mode register data MrrData1 to the mode register data storage unit 1 in response to the fourth pointer signal MrFifoOut.

As an example, please continue to refer to FIG. 8e. In an embodiment of the present application, the driving clock frequency of the third pointer signal MrFifoIn and the fourth pointer signal MrFifoOut are the same, so as to facilitate the realization of the first-in first-out data processing unit 22 to read data and precise control of the time difference between output data.

Figure 8F:
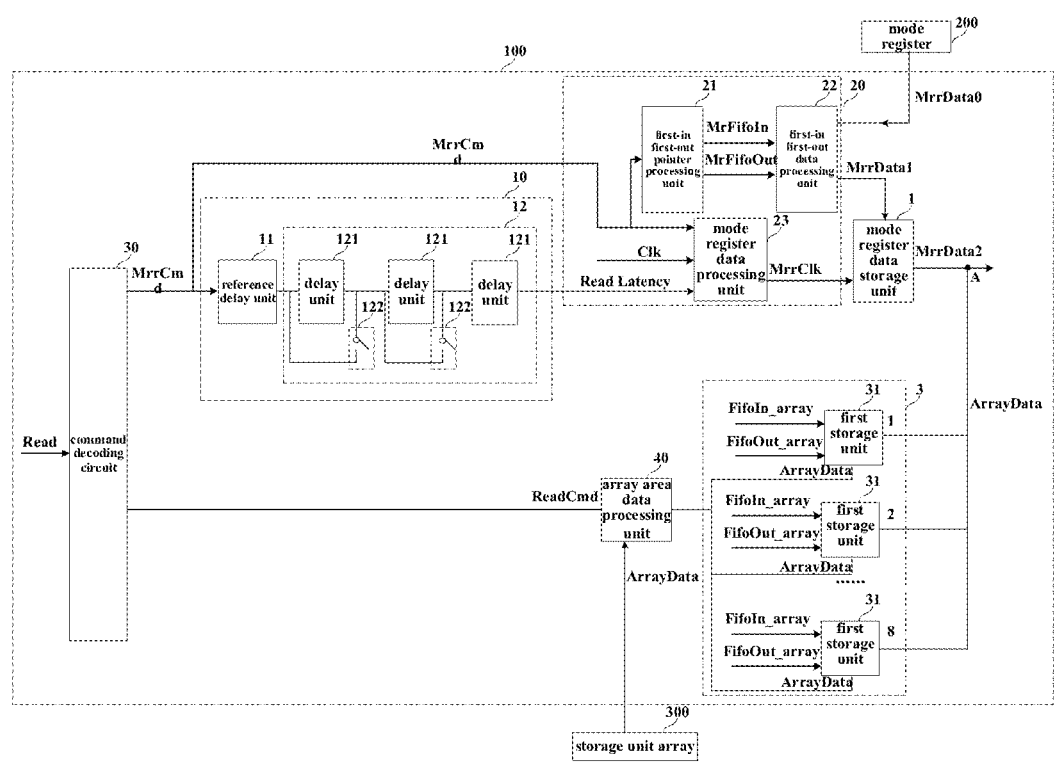
FIG. 8f is a structural block diagram of a data transmission circuit provided according to the eleventh embodiment of this application.

Further, referring to FIG. 8f, in an embodiment of the present application, the data transmission circuit 100 further includes a command decoding circuit 30 and an array area data processing unit 40, the first output terminal of the command decoding circuit 30 and the mode register read command processing. The input terminal of the mode register read command processing unit 23 and the input terminal of the first-in first-out pointer processing unit 21 are both connected to receive the read command, decode the read command Read and determine whether the read command Read is the mode register read command MrrCmd, if so, the output mode register read Command MrrCmd, otherwise, it generates the array area data read command ReadCmd: the input end of the array area data processing unit 40 is connected to the second output end of the command decoding circuit 30, and is used to respond to the array area data read command ReadCmd from the storage unit array 300 to read the data Array Data in the array area to provide the array area data storage unit 3.

Figure 8G:
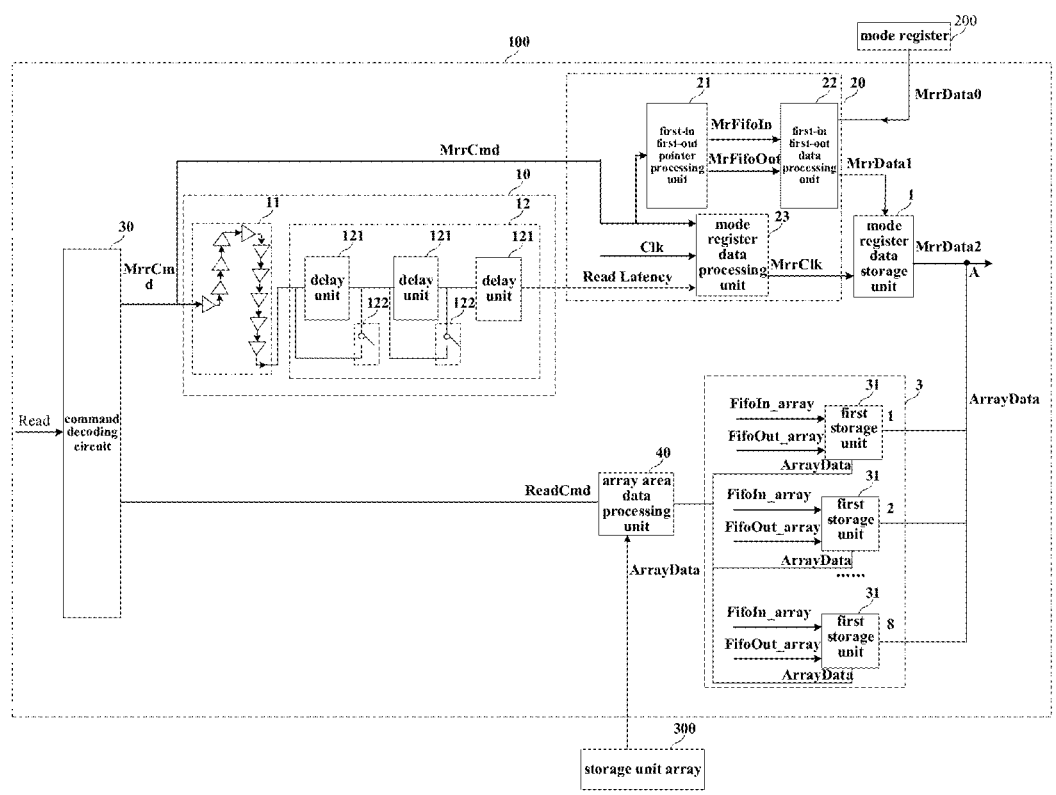
FIG. 8g is a schematic diagram of an embodiment of FIG. 8f.

As an example, please refer to FIG. 8g. It can be set that the reference delay unit 11 includes several sub-delay units connected in series. The sub-delay units can be used to replicate the operation delay of the functional unit with fixed delay time, wherein the functional unit with fixed delay time is set in the transmission path of reading out the array area data by the array area data processing unit 40 responding the array area data read command. The operational delay of the controllable delay unit 12 is set and matches the delay time of the functional unit with variable delay time, wherein the functional unit with variable delay time is set in the transmission path of reading out the array area data by the array area data processing unit 40 responding the array area data read command, so as to improve the efficiency and accuracy of adjusting the operation delay of the controllable delay module 10 to the first preset threshold.

Figure 9A:
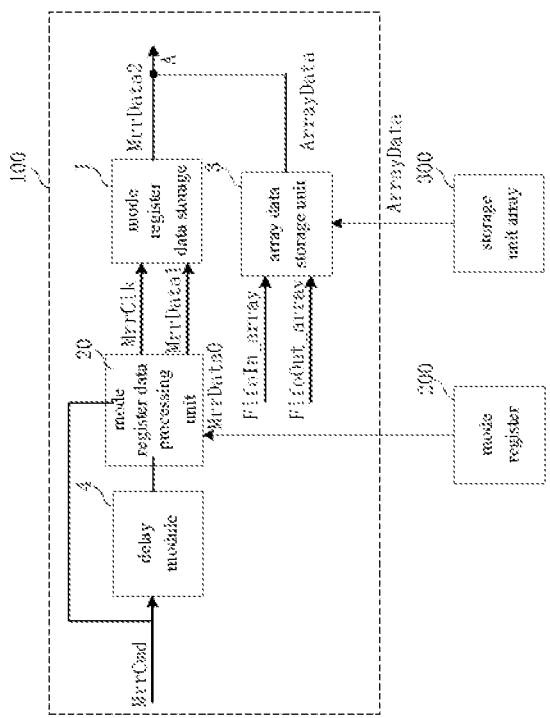
FIG. 9a is a structural block diagram of a data transmission circuit provided according to a twelfth embodiment of this application.

Please refer to FIG. 9a. In an embodiment of the present application, a data transmission circuit 100 is provided, which includes a delay module 4, a mode register data processing unit 20, an array area data storage unit 3, and a mode register data storage unit 1. Module 4 is used to generate a preset read delay signal Read Latency after receiving the mode register read command MrrCmd after a first preset time delay: the mode register data processing unit 20 is connected to the delay module 4 and the mode register data storage unit 1, used to respond to the mode register read command MrrCmd to read the mode register data MrrData0 from the mode register 200, and also used to output the mode register data MrrData1 to the mode register data storage unit 1 in response to the preset read delay signal Read Latency: array area data storage The output terminal of the array area data storage unit 3 and the output terminal of the mode register data storage unit 1 are both connected to the first node A. The array area data storage unit 3 are used to receive the array area data Array Data in response to the first pointer signal FifoIn_array, and are also used to output the array area in response to the second pointer signal FifoOut_array Data Array Data; and the mode register data storage unit 1 is used to output the mode register data MrrData2 in response to the first clock signal MrrClk.

As an example, please refer to FIG. 9a, by setting the delay module 4 from the moment when the mode register read command MrrCmd is received, after a first preset time delay, the preset read delay signal Read Latency is generated, so that the mode register data processing unit 20 responds to the mode register The read command MrrCmd reads the mode register data MrrData0 from the mode register 200, and outputs the mode register data MrrData1 to the mode register data storage unit 1 in response to the preset read delay signal Read Latency; and sets the mode register data storage unit 1 to respond to the first clock signal MrrClk outputs the mode register data MrrData2, the output end of the array area data storage unit 3 and the output end of the mode register data storage unit 1 are both connected to the first node, and the array area data storage unit 3 can receive the array area in response to the first pointer signal FifoIn_array. The data Array Data responds to the second pointer signal FifoOut_array to output the array area data Array Data, which realizes the differentiated control of the mode register data storage unit 1 and the array area data storage unit 3, so that the time to read out the mode register data MrrData2 in response to the mode register read command MrrCmd will be matched with the time to read out the array area data Array Data in response to the array area data read command ReadCmd, and the precision control mode register data MrrData2 and the array area data Array Data are sequentially output through their respective output channels.

Figure 9B:
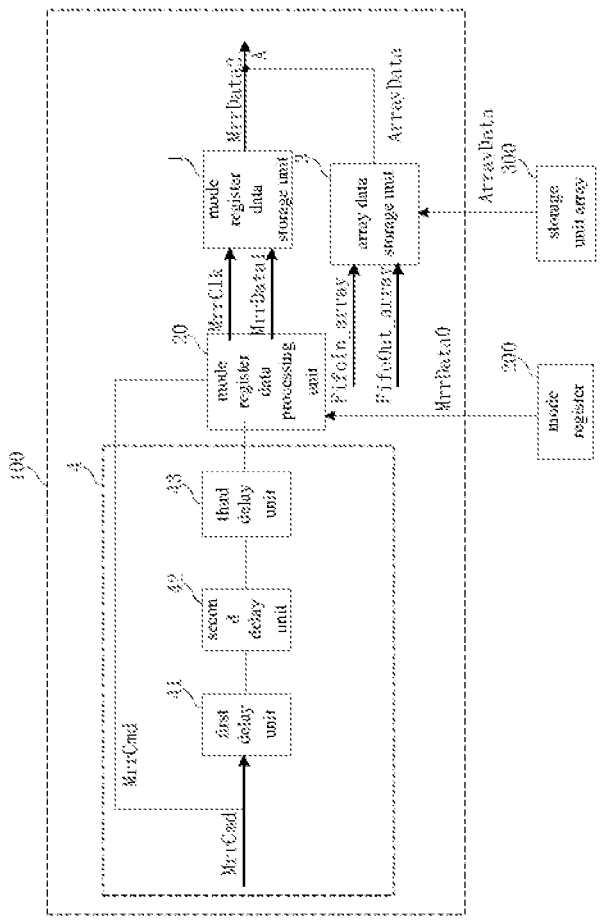
FIG. 9b is a structural block diagram of a data transmission circuit provided according to the thirteenth embodiment of this application.

Further, referring to FIG. 9b, in an embodiment of the present application, the delay module 4 includes a first delay unit 41, a second delay unit 42, and a third delay unit 43. The first delay unit 41 is used for the self-receiving mode register. From the moment of the read command MrrCmd, after a second preset time delay, a first preset read delay signal is generated: the second delay unit 42 is connected to the output terminal of the first delay unit 41 for self-receiving the first preset read delay signal from time on, after the third preset time is delayed, the second preset read delay signal is generated, and the third preset time is equal to the operation delay of the column selection control module (not shown): the third delay unit 43 and the output terminal of the second delay unit 42 and the input terminal of the mode register data processing unit 20 are both connected to generate a preset read delay signal Read Latency after a fourth preset time delay from the moment of receiving the second preset read delay signal: wherein, the sum of the second preset time, the third preset time, and the fourth preset time is equal to the first preset time. This embodiment can avoid the influence of the operation delay of the column selection control module in a specific type of semiconductor storage device on the transmission circuit.

Figure 9C:
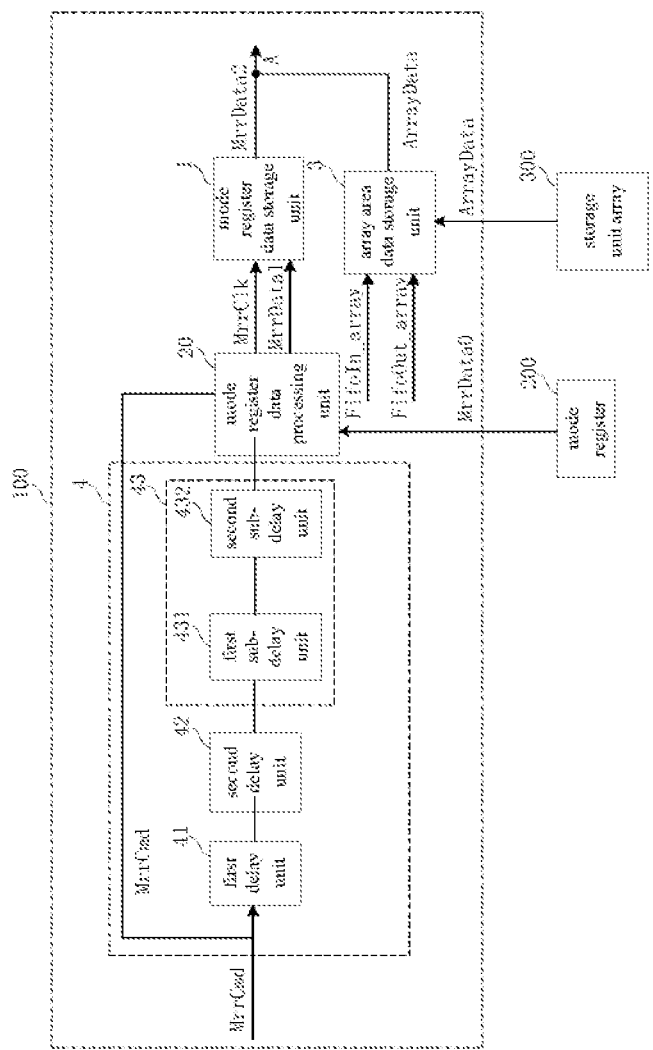
FIG. 9c is a structural block diagram of a data transmission circuit provided according to the fourteenth embodiment of this application.

Further, please refer to FIG. 9c. In an embodiment of the present application, the third delay unit 43 includes a first sub-delay unit 431 and a second sub-delay unit 432. The output terminal is connected to generate a third preset read delay signal after a fifth preset time delay from the moment of receiving the second preset read delay signal, and the fifth preset time is equal to the operation delay of the read-write amplifier: The second sub-delay unit 432 is connected to the output end of the first sub-delay unit 431 and the input end of the mode register data processing unit 20, and is used to delay the sixth preset time from the moment of receiving the third preset read delay signal. A preset read delay signal Read Latency is generated: wherein the sum of the fifth preset time and the sixth preset time is equal to the fourth preset time. This embodiment can avoid the influence of the operation delay of the read-write amplifier in a specific type of semiconductor storage device on the transmission circuit.

As an example, please continue to refer to FIG. 9c. In an embodiment of the present application, the array area data storage unit 3 includes a plurality of first storage units 31 (not shown in FIG. 9c), and the output terminal of each first storage units 31 is connected to the first node A, the input end of each first storage units 31 is connected to the first data signal line, and the first data signal line is used to transmit array area data Array Data.

As an example, please continue to refer to FIG. 9c. In an embodiment of the present application, the driving clock frequency of the first pointer signal FifoIn_array and the second pointer signal FifoOut_array are the same.

Figure 9D:
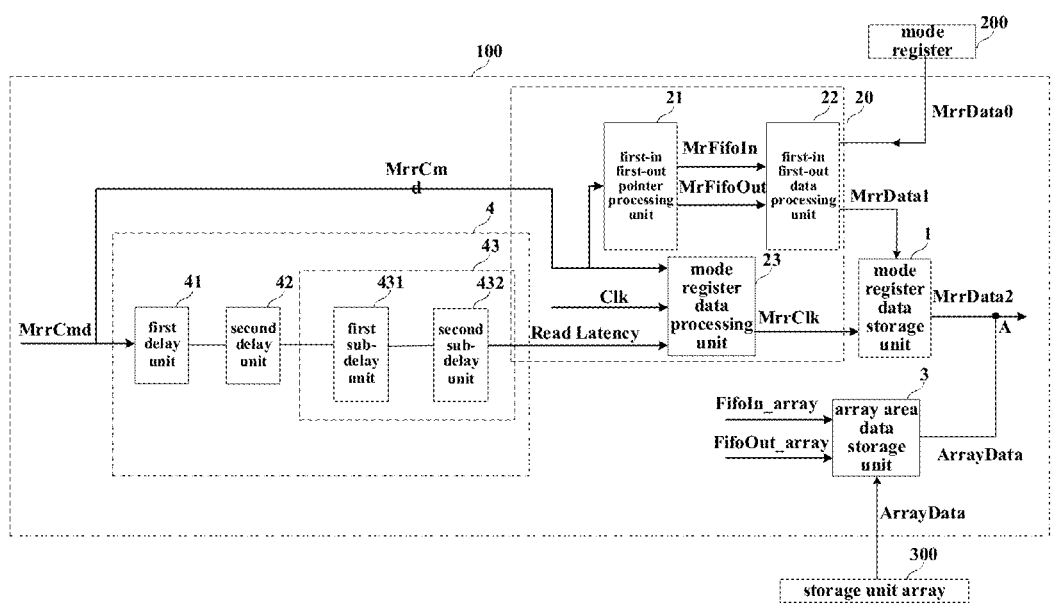
FIG. 9d is a structural block diagram of a data transmission circuit provided according to the fifteenth embodiment of this application.

Further, referring to FIG. 9d, in an embodiment of the present application, the mode register data processing unit 20 includes a first-in first-out pointer processing unit 21, a first-in first-out data processing unit 22, and a mode register read command processing unit 23. The mode register read command processing unit 23 is used to generate the first clock signal MrrClk according to the received mode register read command MrrCmd, the second clock signal Clk and the preset read delay signal Read Latency: the first-in first-out pointer processing unit 21 is used to respond to the mode register read command MrrCmd generates the third pointer signal MrFifoIn and the fourth pointer signal MrFifoOut: the first-in first-out data processing unit 22 is connected with the first-in first-out pointer processing unit 21 and the mode register data storage unit 1 to respond to the third pointer signal MrFifoIn from the mode register 200 reads the mode register data MrrData0, and is also used to output the mode register data MrrData1 to the mode register data storage unit 1 in response to the fourth pointer signal MrFifoOut. In an embodiment of the present application, the driving clock frequency of the third pointer signal MrFifoIn and the fourth pointer signal MrFifoOut are the same.

Figure 9E:
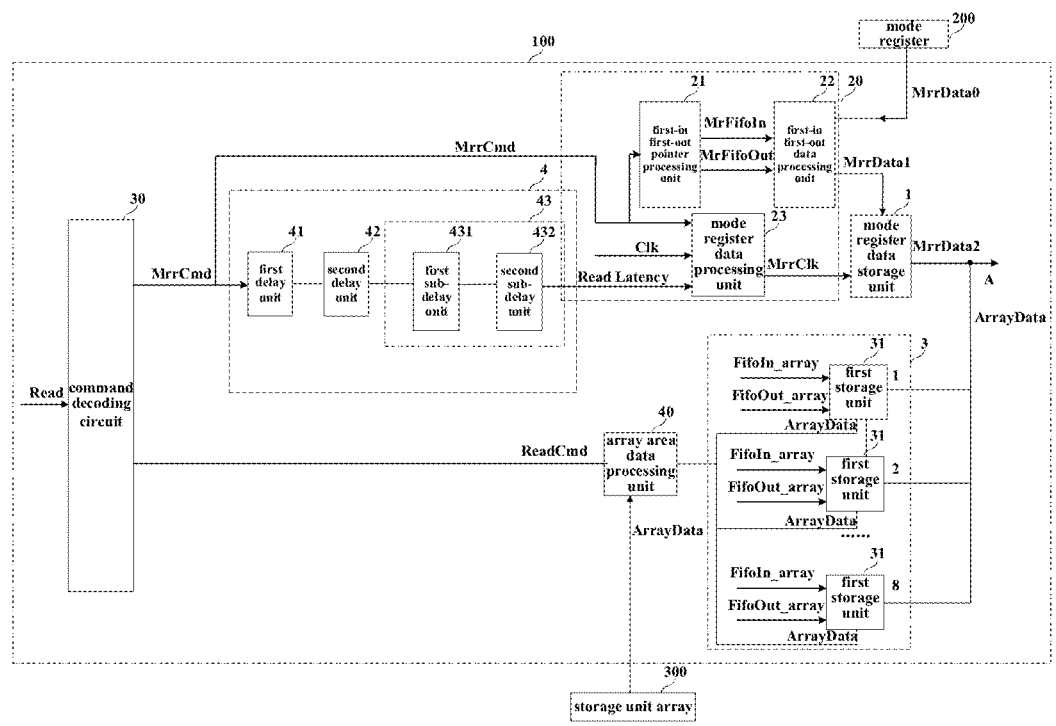
FIG. 9e is a structural block diagram of a data transmission circuit provided according to the sixteenth embodiment of this application.
Figure 9F:
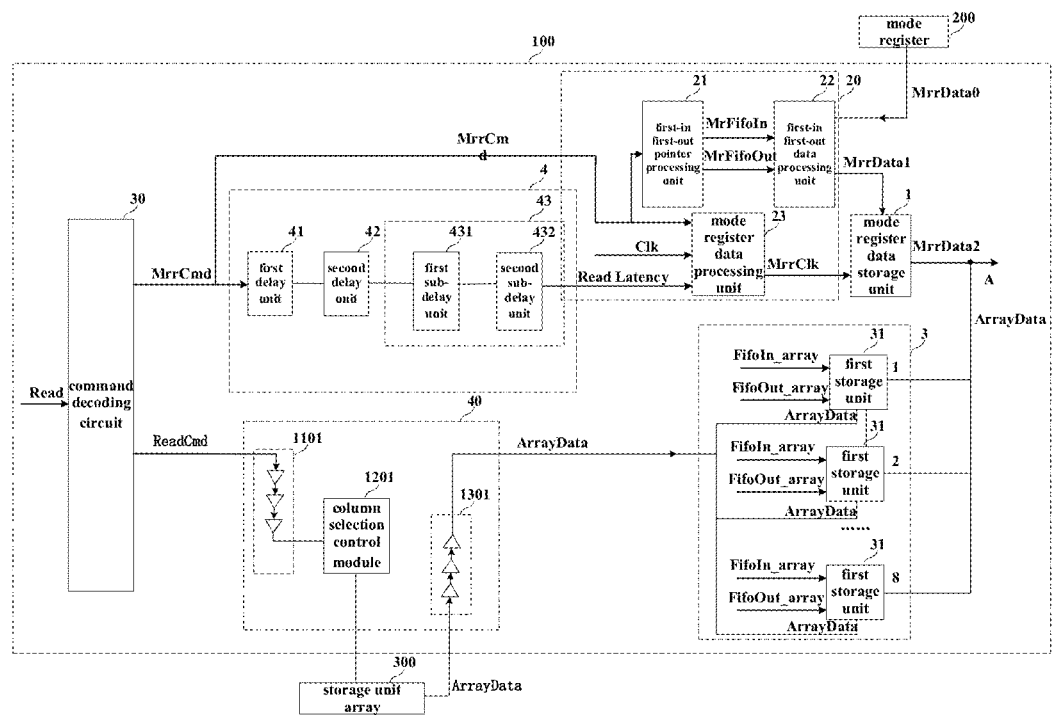
FIG. 9f is a schematic diagram of an embodiment of FIG. 9e.

Further, please refer to FIGS. 9e and 9f. In an embodiment of the present application, the data transmission circuit 100 further includes a command decoding circuit 30 and an array area data processing unit 40, a first output terminal of the command decoding circuit 30 and a mode register. The input terminal of the mode register read command processing unit 23 and the input terminal of the first-in first-out pointer processing unit 21 are both connected to receive the read command, decode the read command Read and determine whether the read command Read is the mode register read command MrrCmd, and if so, output the mode register read command MrrCmd, otherwise, the array area data read command ReadCmd is generated: the input end of the array area data processing unit 40 is connected to the second output end of the command decoding circuit 30 for responding to the array area data read command ReadCmd from the storage unit. The array area data Array Data is read from the storage unit array 300 to provide the array area data storage unit 3.

As an example, please continue to refer to FIG. 9f, the delay time of the array area data processing unit 40 responding to the array area data read command and reading the array area data can be equivalent to the delay time of the first read operation delay unit 1101 and the column selection control module 1201. The sum of the operation delay of column selection control module 1201 and the delay time of the third read operation delay unit 1301, by setting the second delay unit 42 to replicate the operation delay of the column selection control module 1201, set the delay time of the first delay unit 41 and the first read operation delay. The delay time of the first read operation delay unit 1101 is matched, and the delay time of the third delay unit 43 is set to match the delay time of the third read operation delay unit 1301, so that the response mode register read command MrrCmd reads the set parameter MrrData2 time, and the response array area data. The time of the read command to read the data in the array area matches.

Further, please continue to refer to FIG. 7. In an embodiment of the present application, the difference between the operation delay of the array area data processing unit 40 and the first preset time may be set to a preset threshold, so as to satisfy a specific type of semiconductor storage devices such as dynamic random access memory (DRAM) requires operating parameters.

Figure 10A:
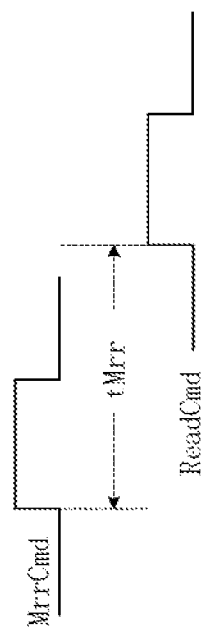
FIG. 10a is a schematic diagram of a response sequence of a data transmission circuit to a read command according to an embodiment of the application.
Figure 10B:
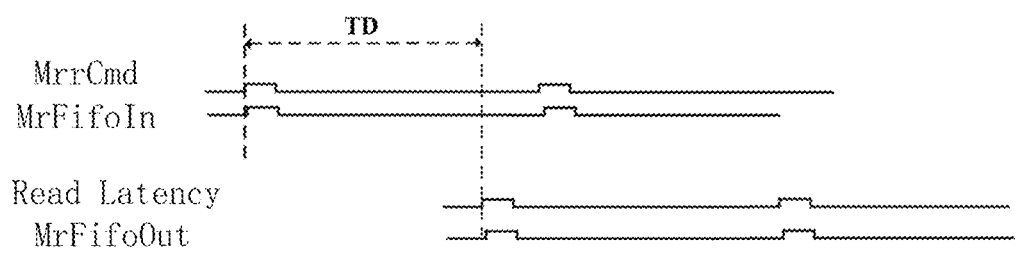
FIG. 10b is a schematic diagram of a working sequence of a data transmission circuit provided according to an embodiment of the application.

As an example, please refer to FIG. 10a and FIG. 10b. In an embodiment of the present application, the frequency of the third pointer signal MrFifoIn and the mode register read command MrrCmd can be set to be the same, and the fourth pointer signal MrFifoOut and the preset read delay signal can be set the same as the frequency of Read Latency is. The time difference between the drive time of the preset read delay signal Read Latency and the drive time of the mode register read command MrrCmd is set to be the first preset time Td, and the operation delay of the array area data processing unit 40 is set to be the same as the first preset time Td is. The difference of a preset time is the preset threshold, so that the time for responding to the mode register read command MrrCmd to read the set parameter MrrData2 matches the time for responding to the array area data read command ReadCmd to read the array area data Array Data.

As an example, in an embodiment of the present application, the preset threshold may be set to an integer multiple of the column refresh period to meet the requirements of the operating parameters of a specific type of semiconductor storage device, such as LPDDR4.

Figure 11A:
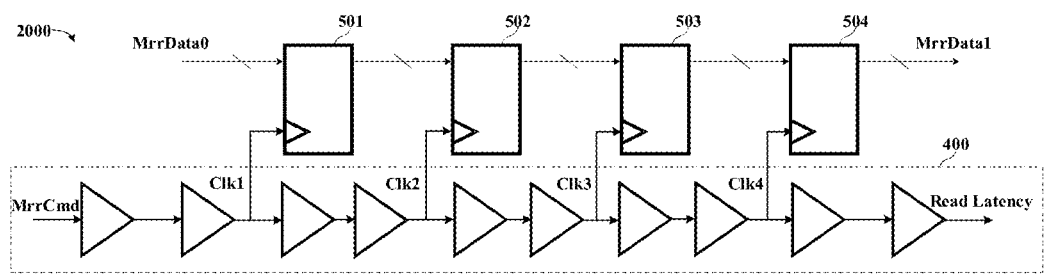
FIG. 11a is a structural block diagram of a delay circuit for responding to a mode register read command.
Figure 11B:
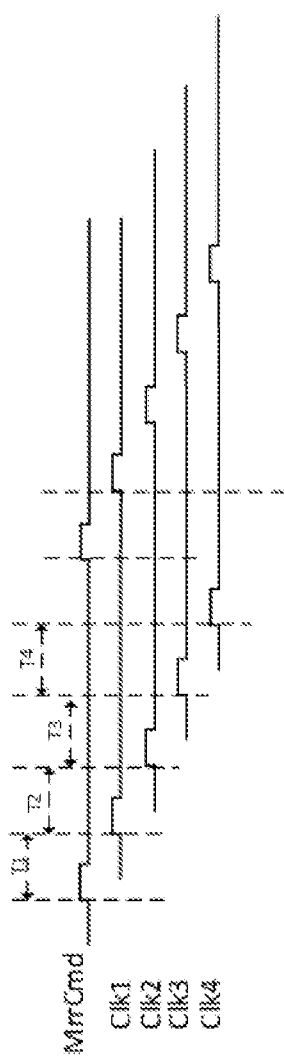

FIG. 11a is a delay circuit 2000 that reads the setting parameter MrrData0 from the mode register 200 in response to the mode register read command MrrCmd in a data transmission circuit, and FIG. 11b is a schematic diagram of the working sequence of FIG. 11a. The delay circuit 2000 includes a first flip-flop 501, a second flip-flop 502, a third flip-flop 503, a fourth flip-flop 504, and a delay chain 400. The delay chain 400 is used to generate the first clock signal Clk1 in response to the mode register read command MrrCmd. The second clock signal Clk2, the third clock signal Clk3, the fourth clock signal Clk4, and the preset read delay signal Read Latency, where the first flip-flop 501 is used to receive the setting parameter MrrData0 in response to the first clock signal Clk1, and the second flip-flop 502 is used to receive data provided by the first flip-flop 501 in response to the second clock signal Clk2, the third flip-flop 503 is used to receive data provided by the second flip-flop 502 in response to the third clock signal Clk3, and the fourth flip-flop 504 is used to respond to the data provided by the third flip-flop 503 in response to the fourth clock signal Clk4 and outputs the setting parameter MrrData1. The response mode register read command MrrCmd is controlled by controlling the driving time of the first clock signal Clk1, the second clock signal Clk2, the third clock signal Clk3, the fourth clock signal Clk4, and the preset read delay signal Read Latency generated by the delay chain 400. The time to read the set parameter MrrData2 matches the time to read the array area data Array Data in response to the array area data read command ReadCmd.

Figure 11C:
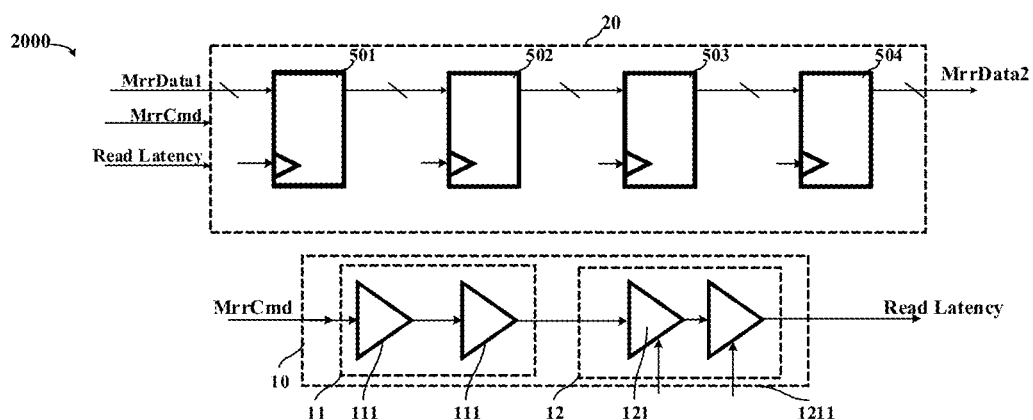
FIG. 11c is a block diagram of another delay circuit for responding to mode register read commands.

Refer to FIG. 11a and FIG. 11c at the same time. Each clock (Clk1, Clk2, Clk3, Clk4) in FIG. 11a needs to be deployed to ensure the correct timing of MrrData1 to MrrData2. In comparison. FIG. 11c only needs to deploy MrrCmd to Read Latency The technical solution of FIG. 11c is easier to deploy.

In an embodiment of the present application, a storage device is provided, including a storage unit array 300, a mode register 200, and any data transmission circuit in the embodiments of the present application: wherein, the storage unit array 300 is used to store data in the array area. Array Data, the mode register 200 is used to store the mode register data MrrData0. This embodiment realizes the differentiated control of the mode register data storage unit 1 and the array area data storage unit 3, so that the time for responding to the mode register read command to read the mode register data MrrData2 is the same as responding to the array area data read command to read the array area data Array Data Matches the time and precisely controls the mode register data MrrData2 and the array area data Array Data are output through their respective output channels in turn.

Figure 12:
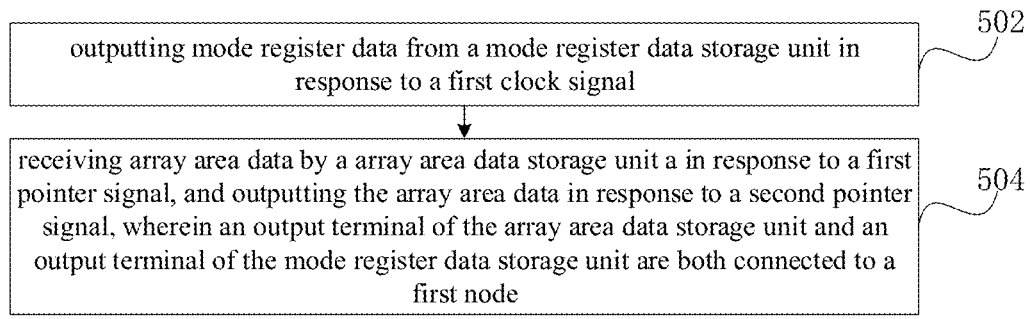
FIG. 12 is a schematic flowchart of a data transmission method provided according to an embodiment of this application.

Referring to FIG. 12, a data transmission method is provided according to an embodiment of the present application, the method includes the following steps.

Step 502: outputting mode register data from a mode register data storage unit in response to a first clock signal; and Step 504, receiving array area data by an array area data storage unit in response to a first pointer signal in response to the first pointer signal, and outputting the array area data in response to the second pointer signal, wherein the output terminal of the array area data storage unit and the output terminal of the mode register data storage unit are both connected to a first node.

As an example, please continue to refer to FIG. 12, by outputting the mode register data based on the mode register data storage unit in response to the first clock signal, and receiving the array area data in response to the first pointer signal based on the array area data storage unit and outputting the array area data in response to the second pointer signal, the output terminal of the array area data storage unit and the output terminal of the mode register data storage unit are both connected to the first node, so as to realize the connection between the mode register data storage unit and the array area data storage unit. Differentiate control, so that the time of responding to the mode register read command to read the data of the mode register matches the time of responding to the array area data read command to read the array area data, and accurately control the mode register data and the array area data to output through their respective output channels in turn.

Figure 13:
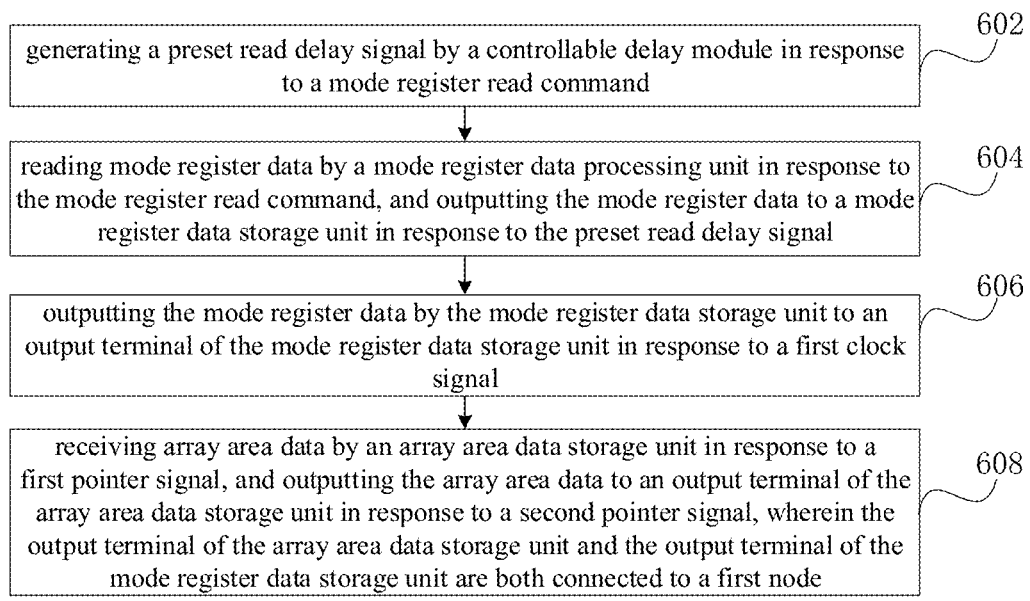
FIG. 13 is a schematic flowchart of a data transmission method provided according to another embodiment of this application.

Please refer to FIG. 13, in an embodiment of the present application, a data transmission method is provided, including the following steps:

Step 602: generating a preset read delay signal by a controllable delay module in response to a mode register read command:

Step 604: reading mode register data by a mode register data processing unit in response to the mode register read command, and outputting the mode register data to a mode register data storage unit in response to the preset read delay signal:

Step 606: outputting the mode register data by the mode register data storage unit to an output terminal of the mode register data storage unit in response to a first clock signal; and Step 608: receiving array area data by an array area data storage unit in response to a first pointer signal, and outputting the array area data to an output terminal of the array area data storage unit in response to a second pointer signal, wherein the output terminal of the array area data storage unit and the output terminal of the mode register data storage unit are both connected to a first node.

As an example, please continue to refer to FIG. 13, the controllable delay module, in response to a mode register read command, generate a preset read delay signal, so that the mode register data processing unit responds to the mode register read command to read the mode register data from the mode register. And in response to the preset read delay signal, output the mode register data to the mode register data storage unit: the mode register data storage unit, in response to the first clock signal, output the mode register data, and based on the array area data storage unit being able to respond to the first clock signal. A pointer signal receives the data in the array area and outputs the data in the array area in response to the second pointer signal, wherein the output end of the array area data storage unit and the output end of the mode register data storage unit are both connected to the first node to realize the pairing. The difference in control between the mode register data storage unit and the array area data storage unit makes the time of responding to the mode register read command to read the data of the mode register match with the time of responding to the array area data read command to read the array area data to accurately control the mode register data and array area data are output through their respective output channels in turn. Once the operation delay of the controllable delay module in this application is determined, it is less affected by changes in the working environment, which can effectively avoid control errors in the data transmission path due to the influence of the working environment; and the operation delay of the controllable delay module can be controlled and adjusted, thereby the operation can meet the operating parameter requirements of different types of semiconductor storage devices. Once the operation delay of the controllable delay module is determined, it is less affected by changes in the working environment, which can effectively avoid control errors in the data transmission path due to the influence of the working environment; and the operation delay of the controllable delay module can be controlled and adjusted to meet the operating parameter requirements of different types of semiconductor storage devices.

Figure 14:
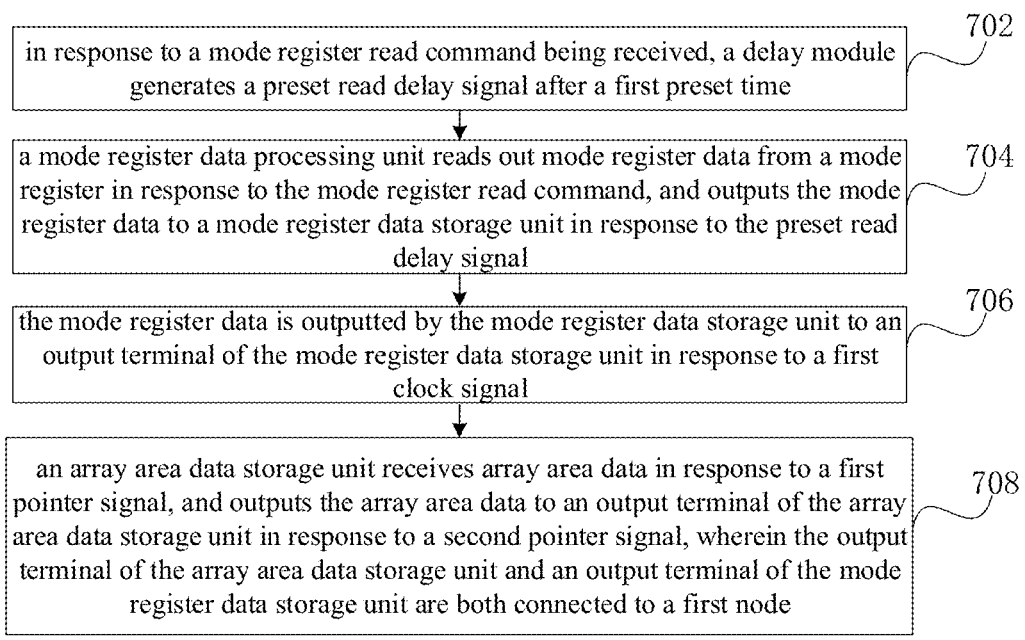
FIG. 14 is a schematic flowchart of a data transmission method provided according to another embodiment of this application.

Referring to FIG. 14, in an embodiment of the present application, a data transmission method is provided, including the following steps:

Step 702, in response to a mode register read command being received, a delay module generates a preset read delay signal after a first preset time:

Step 704, a mode register data processing unit reads mode register data from a mode register in response to the mode register read command, and outputs the mode register data to a mode register data storage unit in response to the preset read delay signal:

Step 706: the mode register data is outputted by the mode register data storage unit to an output terminal of the mode register data storage unit in response to a first clock signal, and Step 708, an array area data storage unit receives array area data in response to a first pointer signal, and outputs the array area data to an output terminal of the array area data storage unit in response to a second pointer signal, wherein the output terminal of the array area data storage unit and an output terminal of the mode register data storage unit are both connected to a first node.

As an example, please continue to refer to FIG. 14. based on the delay module from the moment when the mode register read command is received, the delay module generates a preset read delay signal after a first preset time delay: the mode register data processing unit responds to the mode register read command from The mode register reads out the mode register data, and outputs the mode register data to the mode register data storage unit in response to the preset read delay signal: based on the array area data storage unit receives the array area data in response to the first pointer signal, and responds to the second pointer signal and outputs the array area data; and the mode register data is outputted based on the mode register data storage unit in response to the first clock signal: wherein, the output terminal of the array area data storage unit and the output terminal of the mode register data storage unit are both connected to the first node. Therefore the differentiated control of the mode register data storage unit and the array area data storage unit is realized, and the time to read the mode register data in response to the mode register read command matches the time to read the data in the array area in response to the array area data read command. In the precise control mode, the register data and the array area data are sequentially outputted through their respective output channels.

For the specific features of the data transmission method in the above embodiment, please refer to the above description of the data transmission circuit, which will not be repeated here.

It should be understood that although the various steps in the flowcharts of FIGS. 12-14 are displayed in sequence as indicated by the arrows, these steps are not necessarily performed in sequence in the order indicated by the arrows. Unless there is a clear description in this article, there is no strict order for the execution of these steps, and these steps can be executed in other orders. Moreover, at least part of the steps in FIGS. 12-14 may include multiple steps or multiple stages. These steps or stages are not necessarily executed at the same time, but can be executed at different times. The order of execution is not necessarily performed sequentially, but may be performed alternately or alternately with other steps or at least a part of the steps or stages in other steps.

A person of ordinary skill in the art can understand that all or part of the processes in the above-mentioned embodiment methods can be implemented by instructing relevant hardware through a computer program. The computer program can be stored in a non-volatile computer readable storage. In the medium, when the computer program is executed, it may include the procedures of the above-mentioned method embodiments. Wherein, any reference to memory, storage, database or other media used in the embodiments provided in this application may include non-volatile and/or volatile memory. Non-volatile memory may include read only memory (ROM), programmable ROM (PROM), electrically programmable ROM (EPROM), electrically erasable programmable ROM (EEPROM), or flash memory. Volatile memory may include random access memory (RAM) or external cache memory. As an illustration and not a limitation, RAM is available in many forms, such as static RAM (SRAM), dynamic RAM (DRAM), synchronous DRAM (SDRAM), double data rate SDRAM (DDRSDRAM), enhanced SDRAM (ESDRAM), synchronous chain Channel (Synchlink) DRAM (SLDRAM), direct memory bus dynamic RAM (DRDRAM), and memory bus dynamic RAM (RDRAM), etc.

Please note that the above-mentioned embodiments are only for illustrative purposes and are not meant to limit the present invention.

The technical features of the above-mentioned embodiments can be combined arbitrarily. In order to make the description concise, all possible combinations of the various technical features of the above-mentioned embodiments are not described. However, as long as there is no contradiction in the combination of these technical features, they should be It is considered as the range described in this specification.

The above-mentioned embodiments only express several implementation modes of the present application, and their descriptions are relatively specific and detailed, but they should not be understood as limiting the scope of the patent application. It should be pointed out that for those of ordinary skill in the art, without departing from the concept of this application, several modifications and improvements can be made, and these all fall within the protection scope of this application. Therefore, the scope of protection of the patent in this application shall be subject to the appended claims.

The invention claimed is:

1. A data transmission circuit, comprising:
   a mode register data storage unit, wherein the mode register data storage unit outputs mode register data in response to a first clock signal; and an array area data storage unit, wherein the array area data storage unit receives array area data from a storage unit array in response to a first pointer signal, and outputs the array area data in response to a second pointer signal,
wherein an output terminal of the array area data storage unit and an output terminal of the mode register data storage unit are both directly connected to a first node.

2. The data transmission circuit according to claim 1, wherein the array area data storage unit comprises a plurality of first storage units, wherein an output terminal of each of the plurality of first storage units is connected to the first node, wherein an input terminal of each of the plurality of first storage units is connected to a first data signal line, and wherein the first data signal line transmits the array area data.

3. The data transmission circuit according to claim 2, wherein a frequency of the first pointer signal and a frequency of the second pointer signal are the same.

4. The data transmission circuit according to claim 1, further comprising:
a serial-to-parallel conversion circuit, wherein an input terminal of the serial-to-parallel conversion circuit is connected to the first node; and
a data driving module, connected to an output terminal of the serial-to-parallel conversion circuit, wherein the data driving module outputs the mode register data from the mode register data storage unit, or the array area data from the array area data storage unit.

5. The data transmission circuit according to claim 1, further comprising a mode register data processing unit, wherein the mode register data processing unit comprises:
a mode register read command processing unit, configured to generate the first clock signal in response to a mode register read command, a second clock signal, and a preset read delay signal;
a first-in first-out pointer processing unit, configured to respond to the mode register read command to generate a third pointer signal and a fourth pointer signal; and
a first-in first-out data processing unit, connected to the first-in first-out pointer processing unit, the mode register data storage unit, and a mode register, wherein the first-in first-out data processing unit reads the mode register data from the mode register in response to the third pointer signal;
wherein the first-in first-out data processing unit outputs the mode register data to the mode register data storage unit in response to the fourth pointer signal, and
wherein a frequency of the third pointer signal and a frequency of the fourth pointer signal are the same.

6. The data transmission circuit according to claim 5, further comprising:
a command decoding circuit, having a first output terminal connected to an input terminal of the mode register read command processing unit and an input terminal of the first-in first-out pointer processing unit, wherein the command decoding circuit receives a read command, decodes the read command as either a mode register read command or an array area data read command, and outputs either the mode register read command or the array area data read command, respectively; and
an array area data processing unit, wherein an input terminal of the array area data processing unit is connected to a second output terminal of the command decoding circuit, wherein the array area data processing unit responds to the array area data read command by reading the array area data from the storage unit array to the array area data storage unit.

7. The data transmission circuit according to claim 5, wherein the first-in first-out data processing unit comprises:
a plurality of second storage units, wherein output terminals of the plurality of second storage units are all electrically connected to a second node,
wherein each of the plurality of second storage units comprises a storage sub-unit and a driver, wherein an input of the driver is connected to an output of the storage sub-unit, wherein the storage sub-unit receives the mode register data in response to the third pointer signal, wherein the driver outputs the mode register data in response to the fourth pointer signal, and wherein an input of the storage sub-unit is electrically connected to the mode register.

8. A data transmission circuit, comprising:
a controllable delay module, wherein the controllable delay module generates a preset read delay signal in response to a mode register read command;
an array area data storage unit; and
a mode register data processing unit, connected to the controllable delay module, wherein the mode register data processing unit reads mode register data from a mode register in response to the mode register read command, and the mode register data processing unit sends the mode register data to a mode register data storage unit in response to the preset read delay signal;
wherein an output terminal of the array area data storage unit and an output terminal of the mode register data storage unit are both directly connected to a first node, wherein the array area data storage unit receives array area data from a storage unit array in response to a first pointer signal and outputs array area data to the first node in response to a second pointer signal; and
wherein the mode register data storage unit outputs the mode register data to the first node in response to a first clock signal.

9. The data transmission circuit according to claim 8, wherein a start time when the mode register data processing unit outputs the mode register data is different from a time when the controllable delay module receives the mode register read command, and wherein the time difference is a first preset threshold.

10. The data transmission circuit according to claim 9, wherein the controllable delay module comprises:
a reference delay unit for generating an initial preset read delay signal in response to the mode register read command; and
a controllable delay unit, connecting to an output terminal of the reference delay unit and an input terminal of the mode register data processing unit, wherein the controllable delay unit delays a preset delay time from a time receiving an initial preset read delay signal, and generates a preset read delay signal;
wherein, a sum of an operation delay of the controllable delay unit and an operation delay of the reference delay unit is equal to the first preset threshold.

11. The data transmission circuit according to claim 10, wherein the controllable delay unit comprises at least two delay units connected in series;
wherein at least one of the delay units is connected in parallel with one of a plurality of first controllable switch units;
wherein, by controlling on and off of each of the plurality of first controllable switch units, a number of delay units each connected in series between the reference delay unit and the mode register data processing unit in the controllable delay unit is changed to adjust an operation of the controllable delay unit.

12. The data transmission circuit according to claim 8, wherein the array area data storage unit comprises a plurality of first storage units, wherein an output terminal of each of the plurality of first storage units is connected to a first node, wherein input terminals of the plurality of first storage units are all connected to a first data signal line, wherein the first data signal line transmits the array area data, and wherein a frequency of the first pointer signal and a frequency of the second pointer signal are the same.

13. The data transmission circuit according to claim 8, wherein the mode register data processing unit comprises:
    a mode register read command processing unit, configured to generate a first clock signal in response to a mode register read command, a second clock signal, and the preset read delay signal;
    a first-in first-out pointer processing unit, configured to generate a third pointer signal and a fourth pointer signal in response to the mode register read command; and
    a first-in first-out data processing unit, connected to both the first-in first-out pointer processing unit and the mode register data storage unit, wherein the first-in first-out data processing unit reads the mode register data from the mode register in response to the third pointer signal, and outputs the mode register data to the mode register data storage unit in response to the fourth pointer signal;
    a frequency of the third pointer signal and a frequency of the fourth pointer signal are the same.

14. The data transmission circuit according to claim 13, further comprising:
    a command decoding circuit, having a first output terminal connected to an input terminal of the mode register read command processing unit and an input terminal of the first-in first-out pointer processing unit, wherein the command decoding circuit receives a read command, decodes the read command as either a mode register read command or an array area data read command, and outputs either the mode register read command or the array area data read command, respectively; and
    an array area data processing unit, having an input terminal connected to a second output terminal of the command decoding circuit, wherein the array area data processing unit responds to the array area data read command by reading the array area data from the storage unit array to the array area data storage unit.

15. A data transmission circuit, comprising:
    a delay module, configured to generate a preset read delay signal after a first preset time delay from a time when a mode register read command is received; and
    a mode register data processing unit, connected to the delay module, configured to read mode register data from a mode register in response to the mode register read command, wherein the mode register data processing unit sends the mode register data to the mode register data storage unit and outputs the mode register data in response to the preset read delay signal;
    wherein an output terminal of an array area data storage unit and an output terminal of the mode register data storage unit are both directly connected to a first node;
    wherein the array area data storage unit receives array area data from a storage unit array in response to a first pointer signal and outputs array area data to the first node in response to the second pointer signal; and
    wherein the mode register data storage unit outputs the mode register data to the first node in response to a first clock signal.

16. The data transmission circuit according to claim 15, wherein the delay module comprises:
    a first delay unit, configured to generate a first preset read delay signal after a second preset time delays from a time when the mode register read command is received;
    a second delay unit, connected to an output terminal of the first delay unit, and is configured to generate a second preset read delay signal after a third preset time delays from a time of receiving the first preset read delay signal, wherein the third preset time is equal to an operation delay of a column selection control module; and
    a third delay unit, connected to both an output terminal of the second delay unit and an input terminal of the mode register data processing unit;
    wherein the third delay unit delays a fourth preset time from a time when the second preset read delay signal is received, and generates the preset read delay signal; and
    wherein, a sum of the second preset time, the third preset time, and the fourth preset time is equal to a first preset time.

17. The data transmission circuit according to claim 16, wherein the third delay unit comprises:
    a first sub-delay unit, connected to the output terminal of the second delay unit, wherein the first sub-delay unit generates a third preset read delay signal after a fifth preset time delay from a time when the second preset read delay signal is received, wherein the fifth preset time is equal to an operation delay of a read-write amplifier;
    a second sub-delay unit, connected to an output terminal of the first sub-delay unit and the input terminal of the mode register data processing unit;
    wherein the second sub-delay unit delays a sixth preset time delay from a time when the third preset read delay signal is received, wherein the second sub-delay unit generates the preset read delay signal;
    wherein the array area data storage unit comprises a plurality of first storage units, and an output terminal of each of the plurality of first storage unit is connected to the first node, wherein input terminals of each of the plurality of first storage units are all connected to a first data signal line, and wherein the first data signal line is used to transmit the array area data;
    wherein a frequency of the first pointer signal and a frequency of the second pointer signal are the same; and
    wherein, a sum of the fifth preset time and a sixth preset time is equal to the fourth preset time.

18. The data transmission circuit according to claim 15, wherein the mode register data processing unit comprises:
    a mode register read command processing unit, configured to generate the first clock signal in response to the mode register read command, a second clock signal, and the preset read delay signal;
    a first-in first-out pointer processing unit, wherein the first-in first-out pointer processing unit generates a third pointer signal and a fourth pointer signal in response to the mode register read command; and
    a first-in first-out data processing unit, connected to both the first-in first-out pointer processing unit and the mode register data storage unit, wherein the first-in first-out data processing unit reads out the mode register data from the mode register in response to the third pointer signal, responds to the fourth pointer signal, and outputs the mode register data to the mode register data storage unit;

wherein a frequency of the third pointer signal and a frequency of the fourth pointer signal are the same.

19. The data transmission circuit according to claim 18, further comprising:

a command decoding circuit, having a first output terminal connected to the input terminal of the mode register read command processing unit and an input terminal of the first-in first-out pointer processing unit, wherein the command decoding circuit receives a read command, decodes the read command as either a mode register read command or an array area data read command, and outputs either the mode register read command or the array area data read command, respectively; and an array area data processing unit, having an input terminal connected to a second output terminal of the command decoding circuit, wherein the array area data processing unit responds to the array area data read command by reading the array area data from the storage unit array to the array area data storage unit.

\* \* \* \* \*